United States Patent
Yokouchi

(10) Patent No.: US 8,859,443 B2
(45) Date of Patent: Oct. 14, 2014

(54) HEAT TREATMENT METHOD AND HEAT TREATMENT APPARATUS FOR HEATING SUBSTRATE BY IRRADIATING SUBSTRATE WITH FLASH OF LIGHT

(75) Inventor: Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/366,414

(22) Filed: Feb. 6, 2012

(65) Prior Publication Data

US 2012/0238110 A1    Sep. 20, 2012

(30) Foreign Application Priority Data

Mar. 14, 2011 (JP) ................................. 2011-055014
Mar. 14, 2011 (JP) ................................. 2011-055015
Mar. 14, 2011 (JP) ................................. 2011-055162
Mar. 14, 2011 (JP) ................................. 2011-055163

(51) Int. Cl.
| | | |
|---|---|---|
| H01L 21/00 | (2006.01) | |
| H01L 21/687 | (2006.01) | |
| H01L 21/677 | (2006.01) | |
| F27B 17/00 | (2006.01) | |
| H01L 21/67 | (2006.01) | |
| H01L 21/324 | (2006.01) | |

(52) U.S. Cl.
CPC ........ H01L 21/324 (2013.01); H01L 21/68742 (2013.01); H01L 21/68785 (2013.01); H01L 21/67748 (2013.01); F27B 17/0025 (2013.01); H01L 21/67115 (2013.01)
USPC ........... 438/796; 438/797; 438/798; 438/799; 392/407; 392/416; 392/417; 392/418

(58) Field of Classification Search
None
See application file for complete search history.

(56) References Cited

U.S. PATENT DOCUMENTS

| | | | |
|---|---|---|---|
| 6,849,831 B2 | 2/2005 | Timans et al. ................. | 219/390 |
| 2008/0190909 A1 | 8/2008 | Yokuchi | |
| 2008/0273867 A1 | 11/2008 | Camm et al. | |
| 2009/0067823 A1* | 3/2009 | Kusuda ........................ | 392/418 |

(Continued)

FOREIGN PATENT DOCUMENTS

| | | |
|---|---|---|
| JP | 2002-252174 | 9/2002 |
| JP | 2009-070948 | 4/2009 |

(Continued)

OTHER PUBLICATIONS

Office Action issued by Korean Patent Office on Jun. 24, 2013 in connection with corresponding Korean Patent Application No. 10-2012-0005209 with Japanese and English Translation thereof.

(Continued)

*Primary Examiner* — Julio J Maldonado
*Assistant Examiner* — Joseph Galvin, III
(74) *Attorney, Agent, or Firm* — Ostrolenk, Faber LLP

(57) ABSTRACT

The first flash irradiation is performed on a semiconductor wafer preheated to 500° C. to heat a front surface of the semiconductor wafer. Thereafter, the second flash irradiation is performed to reheat the front surface of the semiconductor wafer before the temperature of the front surface of the semiconductor wafer becomes equal to the temperature of a back surface of the semiconductor wafer. Thus, the second flash irradiation is performed before the temperature of the front surface of the semiconductor wafer falls. Even if less energy is consumable by the second flash irradiation, the efficiency of heating of the front surface of the semiconductor wafer resulting from each iteration of the flash irradiation is improved.

24 Claims, 18 Drawing Sheets

(56) References Cited

U.S. PATENT DOCUMENTS

| | | |
|---|---|---|
| 2009/0285568 A1* | 11/2009 | Kiyama et al. ............... 392/418 |
| 2011/0274417 A1 | 11/2011 | Camm et al. |
| 2012/0008926 A1 | 1/2012 | Kusuda |
| 2013/0224967 A1 | 8/2013 | Kusuda |

FOREIGN PATENT DOCUMENTS

| | | |
|---|---|---|
| JP | 2009-277759 | 11/2009 |
| JP | 2010-525581 | 7/2010 |
| KR | 10-2009-0027579 | 3/2009 |

OTHER PUBLICATIONS

Korean Office Action dated Dec. 6, 2013 in corresponding Korean Patent Application No. 10-2012-0005209 (with partial English language translation).

Office Action issued by Taiwanese Patent Office on 06/24/13 in connection with corresponding Taiwanese Patent Application No. 101100377 with Japanese and English Translation thereof.

* cited by examiner

F I G . 4
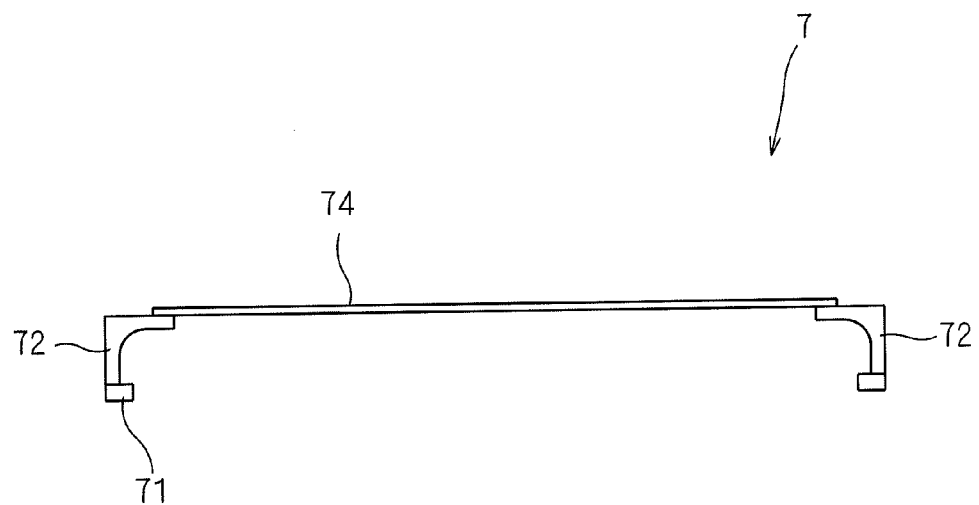

F I G. 5
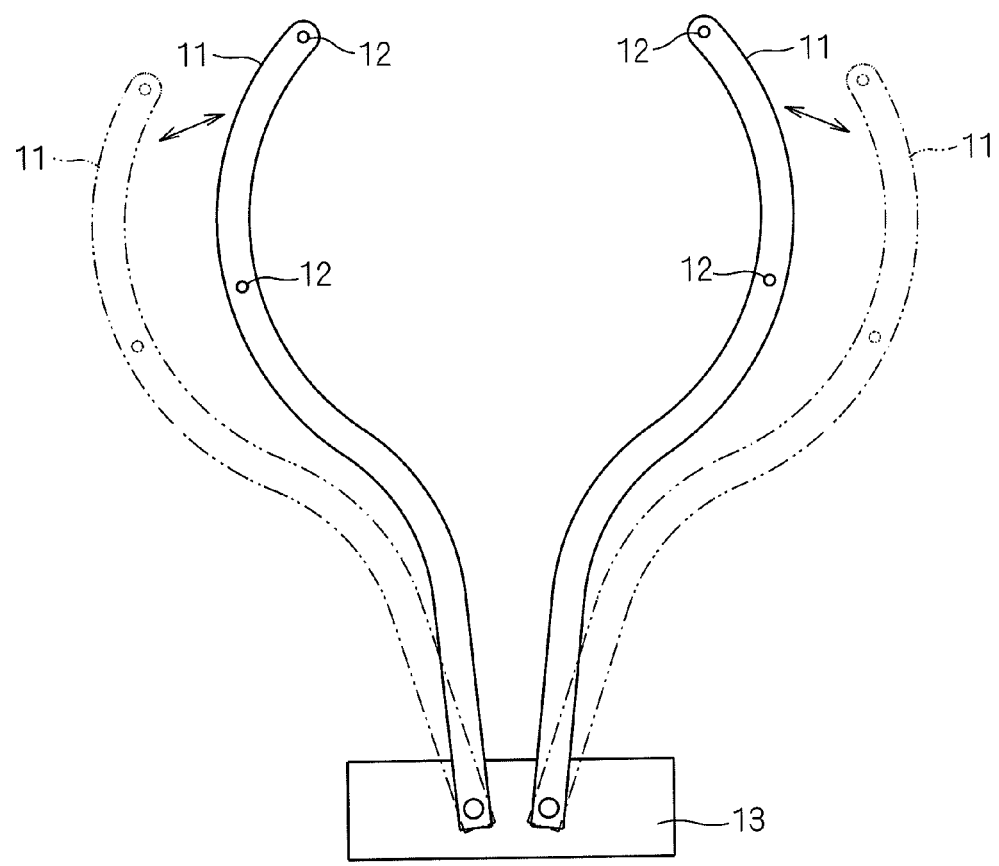

F I G . 7
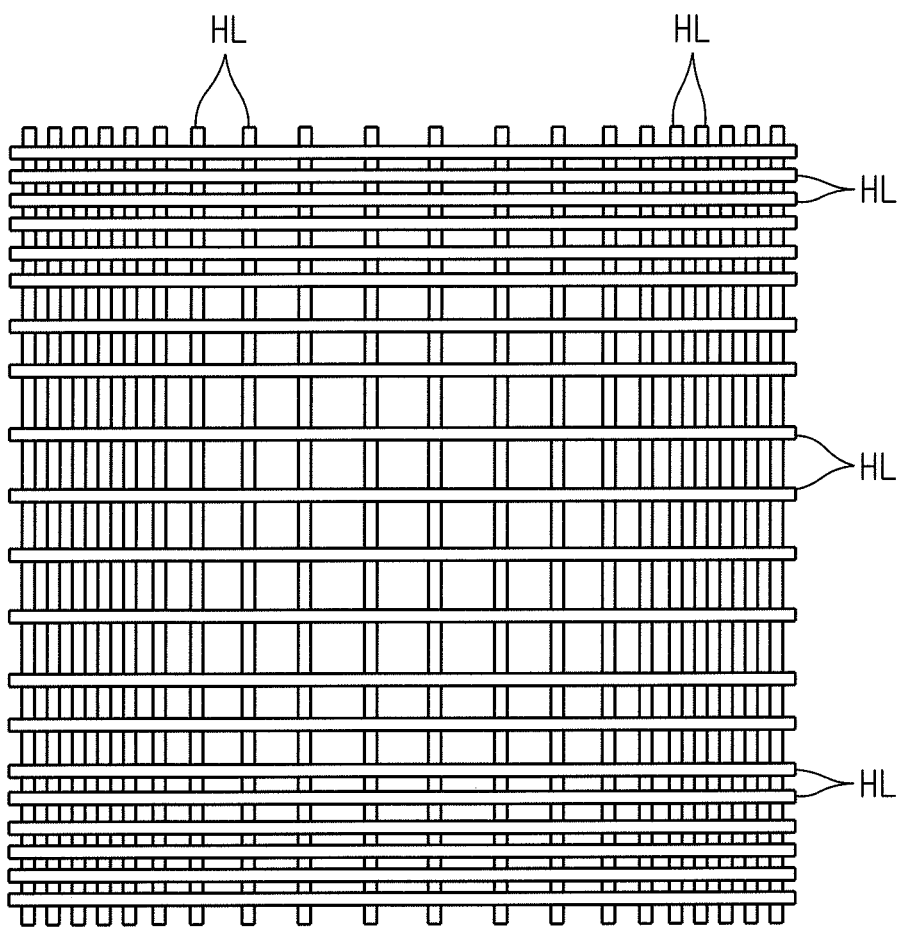

| STEP | On(μsec.) | Off(μsec.) |
|------|-----------|------------|
| 1    | 1000      | 3000       |
| 2    | 900       | —          |

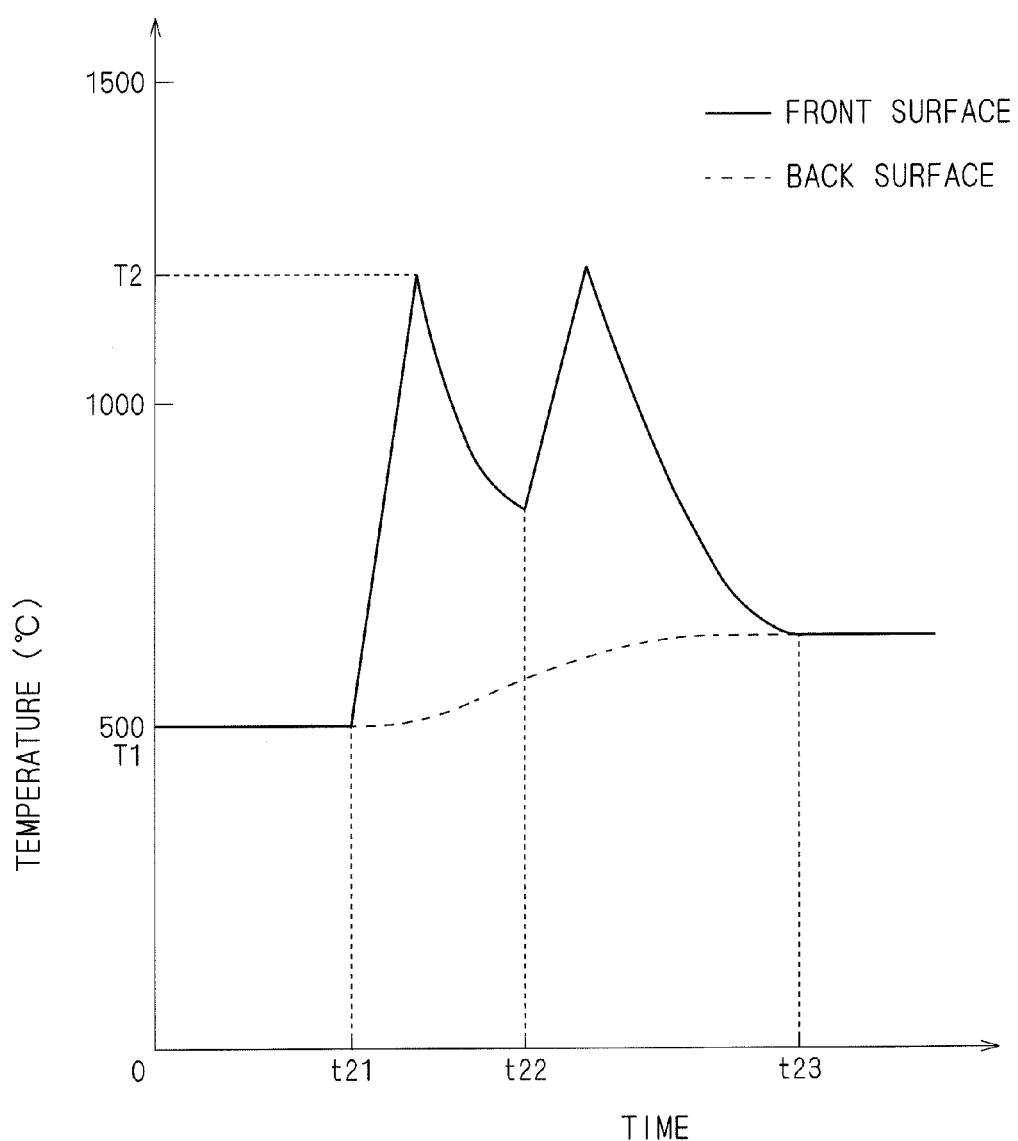
F I G . 1 2

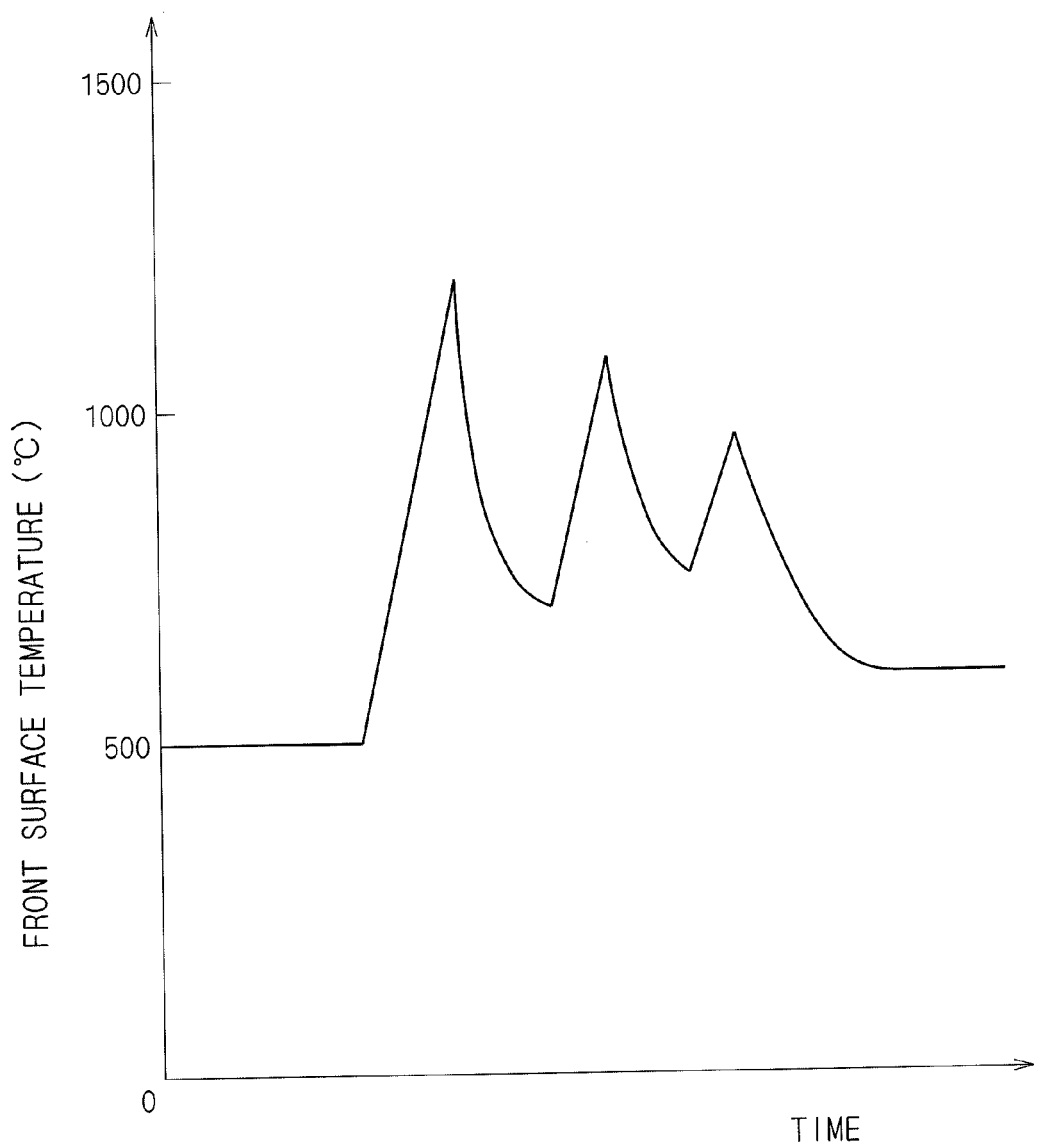
F I G . 1 4

FIG. 15

| PULSE WIDTH (msec.) | CHARGING VOLTAGE (V) | RESIDUAL VOLTAGE (V) | AMOUNT OF CONSUMPTION (%) |
|---|---|---|---|
| 0.8 | 4000 | 3629 | 18 |
| 1.0 | 4000 | 3463 | 25 |
| 1.2 | 4000 | 3284 | 33 |
| 1.4 | 4000 | 3097 | 40 |
| 1.6 | 4000 | 2907 | 47 |

F I G . 1 6

| STEP | On($\mu$ sec.) | Off($\mu$ sec.) |
|---|---|---|
| 1 | 1150 | 4000 |
| 2 | 1200 | 4000 |
| 3 | 1400 | — |

F I G. 1 8

| STEP | On($\mu$sec.) | Off($\mu$sec.) |
|---|---|---|
| 1 | 1200 | 4000 |
| 2 | 1200 | 1500 |
| 3 | 1200 | — |

HEAT TREATMENT METHOD AND HEAT TREATMENT APPARATUS FOR HEATING SUBSTRATE BY IRRADIATING SUBSTRATE WITH FLASH OF LIGHT

BACKGROUND OF THE INVENTION

1. Field of the Invention

The present invention relates to a heat treatment method and a heat treatment apparatus for heating a thin plate-like precision electronic substrate such as a semiconductor wafer and a glass substrate for a liquid crystal display device (hereinafter referred to simply as a "substrate") by irradiating the substrate with a flash of light multiple times.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with a flash of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

In performing the process of activating impurities in a heat treatment apparatus including such xenon flash lamps, it is known that heating the surface of a semiconductor wafer to as high a temperature as possible by irradiating the surface with an intense flash of light achieves sufficient activation of the impurities to reduce the sheet resistance after the process. However, a device pattern is in general formed on the surface of a semiconductor wafer. There arises a problem in that the irradiation with too intense a flash of light causes the destruction of the device. For this reason, the intensity of the flash of light with which the surface of a semiconductor wafer is actually irradiated is suppressed to fall within a range where no device destruction occurs.

A semiconductor wafer with a device pattern formed thereon has a light absorptance which is pattern-dependent. Specifically, since the surface of a semiconductor wafer has a nonuniform absorptance of a flash of light, it is necessary to control the intensity of the flash of light so that the device destruction does not occur in part of the surface of the semiconductor wafer which has the highest light absorptance. However, the optimization of the intensity of the flash of light in the part having the highest light absorptance results in insufficient heating and accordingly insufficient activation of impurities in the remaining parts of the surface of the semiconductor wafer.

To solve these problems, a technique has been proposed which irradiates the surface of a semiconductor wafer doped with impurities with a flash of light multiple times (multi-flash or multi-pulse irradiation). Performing the flash irradiation multiple times allows sufficient activation of impurities over the entire wafer surface to thereby reduce the sheet resistance while suppressing the device destruction. Additionally, performing the flash irradiation multiple times allows the reduction in variations in the sheet resistance at the surface of the semiconductor wafer.

A technique which performs such a multi-flash process is disclosed in U.S. Pat. No. 6,849,831 in which pulsed light emitting lamps such as flash lamps are disposed on the front surface side of a semiconductor wafer and lamps that stay lit continuously such as halogen lamps are disposed on the back surface side thereof so that a desired heat treatment is performed using a combination of these lamps. In a heat treatment apparatus disclosed in U.S. Pat. No. 6,849,831, a semiconductor wafer is preheated to a certain degree of temperature by the halogen lamps and the like, and is then raised in temperature to a desired treatment temperature by performing pulse heating one or multiple times from the flash lamps.

Also, U.S. Patent Application Publication No. 2009/0067823 discloses an apparatus in which an insulated-gate bipolar transistor effects the on-off control of the emission of light from a flash lamp, whereby the surface of a semiconductor wafer is irradiated with a flash of light multiple times.

In the apparatus disclosed in U.S. Patent Application Publication No. 2009/0067823, the on-off control of the emission of light from a flash lamp is effected by storing electrical charges in a capacitor having a predetermined capacitance and intermittently supplying electrical charges from the capacitor to the flash lamp. However, the amounts of electrical charges which the capacitor can store are determined by capacitance and charging voltage. When the flash irradiation is performed multiple times, there are cases where sufficient amounts of electrical charges do not remain in the capacitor, in particular, during later iterations of the flash irradiation. It is impossible to recharge the capacitor during an irradiation time interval between successive iterations of the flash irradiation because this interval is a very short time interval less than one second. As a result, there arises a problem in that the intensity decreases as the number of times of the flash irradiation increases, whereby the attained surface temperature of the semiconductor wafer decreases as the number of times of the flash irradiation increases. The provision of a sufficiently high capacitance of the capacitor and a sufficiently high charging voltage allows the increase in the amounts of electrical charges which the capacitor can store, which will solve the problem. However, this results in a very large-sized power supply section including the capacitor, and significantly increases costs.

SUMMARY OF THE INVENTION

The present invention is intended for a method of heating a substrate by irradiating the substrate with a flash of light n times, where n is an integer not less than two.

According to one aspect of the present invention, the method comprises the steps of: performing the i-th flash irradiation, where i is a positive integer not more than (n−1), on a substrate to heat a front surface of the substrate; and thereafter performing the (i+1)th flash irradiation on the substrate to reheat the front surface of the substrate before the temperature of the front surface of the substrate becomes equal to the temperature of a back surface of the substrate.

The (i+1)th flash irradiation is performed before the temperature of the front surface of the substrate falls following the i-th flash irradiation. This improves the efficiency of heating of the front surface of the substrate resulting from each iteration of the flash irradiation even when consumption energy is decreased with the increasing number of times of the flash irradiation.

According to another aspect of the present invention, the method comprises the step of determining energy consumed during single flash irradiation from a flash lamp by discharging electrical charges stored in a capacitor through the flash lamp as not more than a value obtained by dividing energy stored in the capacitor prior to the initial flash irradiation by (n+1).

This method improves the efficiency of heating of the front surface of the substrate resulting from each iteration of the flash irradiation throughout the n times of the flash irradiation.

According to still another aspect of the present invention, the method comprises the steps of: performing the i-th flash irradiation, where i is a positive integer not more than (n−1), on the substrate for a first irradiation time period by discharging electrical charges stored in a capacitor through a flash lamp; and thereafter performing the (i+1)th flash irradiation on the substrate for a second irradiation time period longer than the first irradiation time period by discharging electrical charges remaining in the capacitor through the flash lamp.

This method extracts more energy remaining in the capacitor which is reduced by being consumed in the prior iteration to improve the efficiency of heating of the front surface of the substrate resulting from each iteration of the flash irradiation.

According to a further aspect of the present invention, n is an integer not less than three, and a first non-irradiation time period is shorter than a second non-irradiation time period, the second non-irradiation time period being a time period between performing the i-th flash irradiation, where i is a positive integer not more than (n−2), on the substrate by discharging electrical charges stored in the capacitor through the flash lamp and performing the (i+1)th flash irradiation on the substrate by discharging electrical charges remaining in the capacitor through the flash lamp, the first non-irradiation time period being a time period between performing the (i+1)th flash irradiation and performing the (i+2)th flash irradiation on the substrate by further discharging electrical charges remaining in the capacitor through the flash lamp.

Thus, before the temperature of the front surface of the substrate falls following the flash irradiation, the next flash irradiation is performed. This improves the efficiency of heating of the front surface of the substrate resulting from each iteration of the flash irradiation.

The present invention is also intended for a heat treatment apparatus for heating a substrate by irradiating the substrate with a flash of light n times, where n is an integer not less than two.

According to one aspect of the present invention, the heat treatment apparatus comprises: a chamber for receiving a substrate therein; a holder for holding the substrate within the chamber; a flash lamp for irradiating the substrate held by the holder with a flash of light; a capacitor for storing electrical charges for emission of light from the flash lamp; and a light emission controller for making and breaking a connection between the capacitor and the flash lamp to control the emission of light from the flash lamp, the light emission controller being configured to control the emission of light from the flash lamp so that the i-th flash irradiation, where i is a positive integer not more than (n−1), is performed from the flash lamp to heat a front surface of the substrate and so that the (i+1)th flash irradiation is thereafter performed to reheat the front surface of the substrate before the temperature of the front surface of the substrate becomes equal to the temperature of a back surface of the substrate.

The (i+1)th flash irradiation is performed before the temperature of the front surface of the substrate falls following the i-th flash irradiation. This improves the efficiency of heating of the front surface of the substrate resulting from each iteration of the flash irradiation even when consumption energy is decreased with the increasing number of times of the flash irradiation.

According to another aspect of the present invention, the light emission controller is configured to make and break the connection between the capacitor and the flash lamp so that energy consumed during single flash irradiation from the flash lamp is not more than a value obtained by dividing energy stored in the capacitor prior to the initial flash irradiation by (n+1).

This heat treatment apparatus improves the efficiency of heating of the front surface of the substrate resulting from each iteration of the flash irradiation throughout the n times of the flash irradiation.

According to still another aspect of the present invention, the light emission controller is configured to control the emission of light from the flash lamp so that the i-th flash irradiation, where i is a positive integer not more than (n−1), is performed on the substrate for a first irradiation time period, and so that the (i+1)th flash irradiation is thereafter performed on the substrate for a second irradiation time period longer than the first irradiation time period.

This heat treatment apparatus extracts more energy remaining in the capacitor which is reduced by being consumed in the prior iteration to improve the efficiency of heating of the front surface of the substrate resulting from each iteration of the flash irradiation.

According to a further aspect of the present invention, n is an integer not less than three, and the light emission controller is configured to control the emission of light from the flash lamp so that a first non-irradiation time period is shorter than a second non-irradiation time period, the second non-irradiation time period being a time period between performing the i-th flash irradiation, where i is a positive integer not more than (n−2), from the flash lamp and performing the (i+1)th flash irradiation, the first non-irradiation time period being a time period between performing the (i+1)th flash irradiation and performing the (i+2)th flash irradiation.

Thus, before the temperature of the front surface of the substrate falls following the flash irradiation, the next flash irradiation is performed. This improves the efficiency of heating of the front surface of the substrate resulting from each iteration of the flash irradiation.

It is therefore an object of the present invention to improve the efficiency of heating of a front surface of a substrate which results from each iteration of flash irradiation when the flash irradiation is performed multiple times.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holder as seen from one side;

FIG. 5 is a plan view of a transfer mechanism;

FIG. 7 is a plan view showing an arrangement of halogen lamps;

FIG. 12 is an enlarged graph of a portion of FIG. 9 showing flash heating and its surroundings;

FIG. 14 is a graph showing changes in the temperature of the front surface of a semiconductor wafer when flash irradiation for an irradiation time period of 1.4 milliseconds is performed there times;

FIG. 15 is a table showing a correlation between a pulse width and the amount of energy consumption during flash irradiation;

FIG. 16 shows an example of the recipe for use according to a third preferred embodiment of the present invention;

FIG. 18 shows an example of the recipe for use according to a fourth preferred embodiment of the present invention.

DESCRIPTION OF THE PREFERRED EMBODIMENTS

Preferred embodiments according to the present invention will now be described in detail with reference to the drawings.

First Preferred Embodiment

Figure 1:
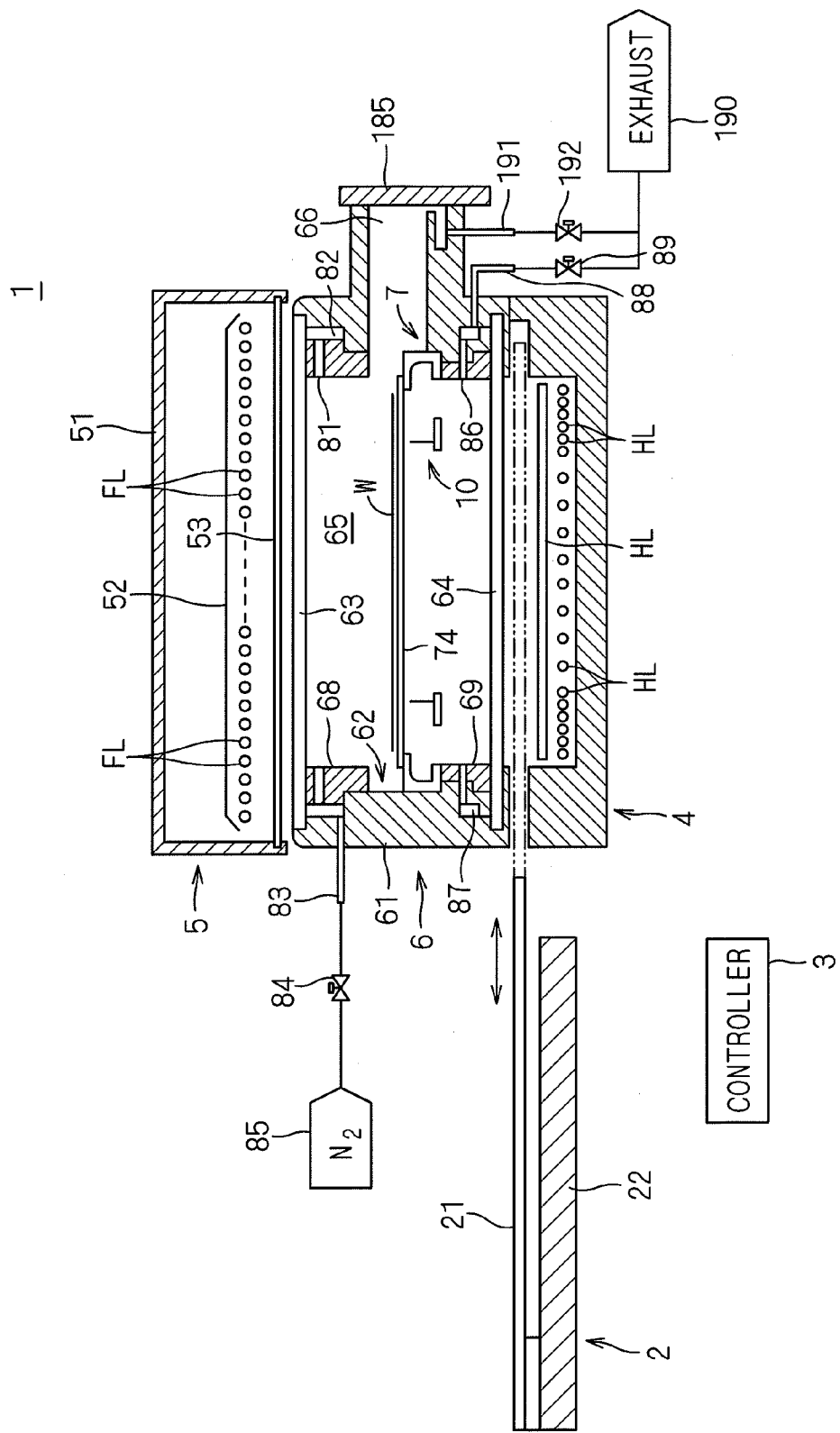
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to a first preferred embodiment of the present invention is a flash lamp annealer for irradiating a disk-shaped semiconductor wafer W having a diameter of 300 mm and serving as a substrate with a flash of light to heat the semiconductor wafer W. A semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 for holding a semiconductor wafer W.

The chamber side portion 61, and the upper and lower reflective rings 68 and 69 are made of, for example, a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into the heat treatment space 65 and to be transported out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
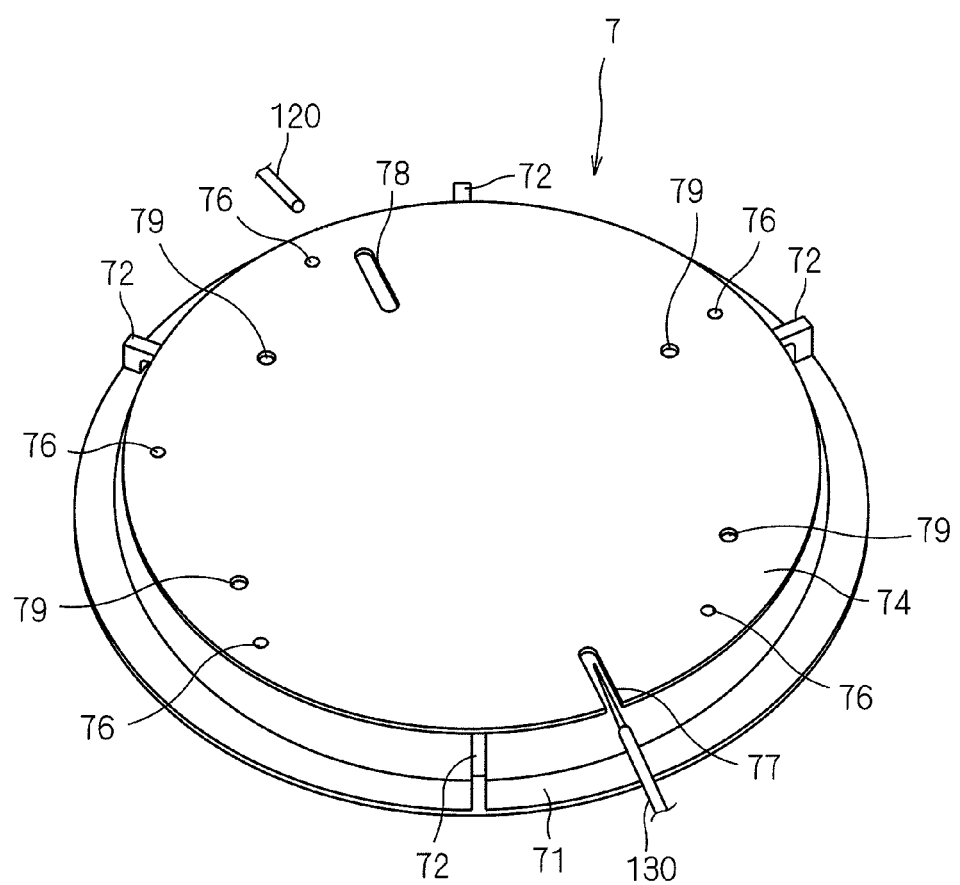
FIG. 2 is a perspective view showing the entire external appearance of a holder.
Figure 3:
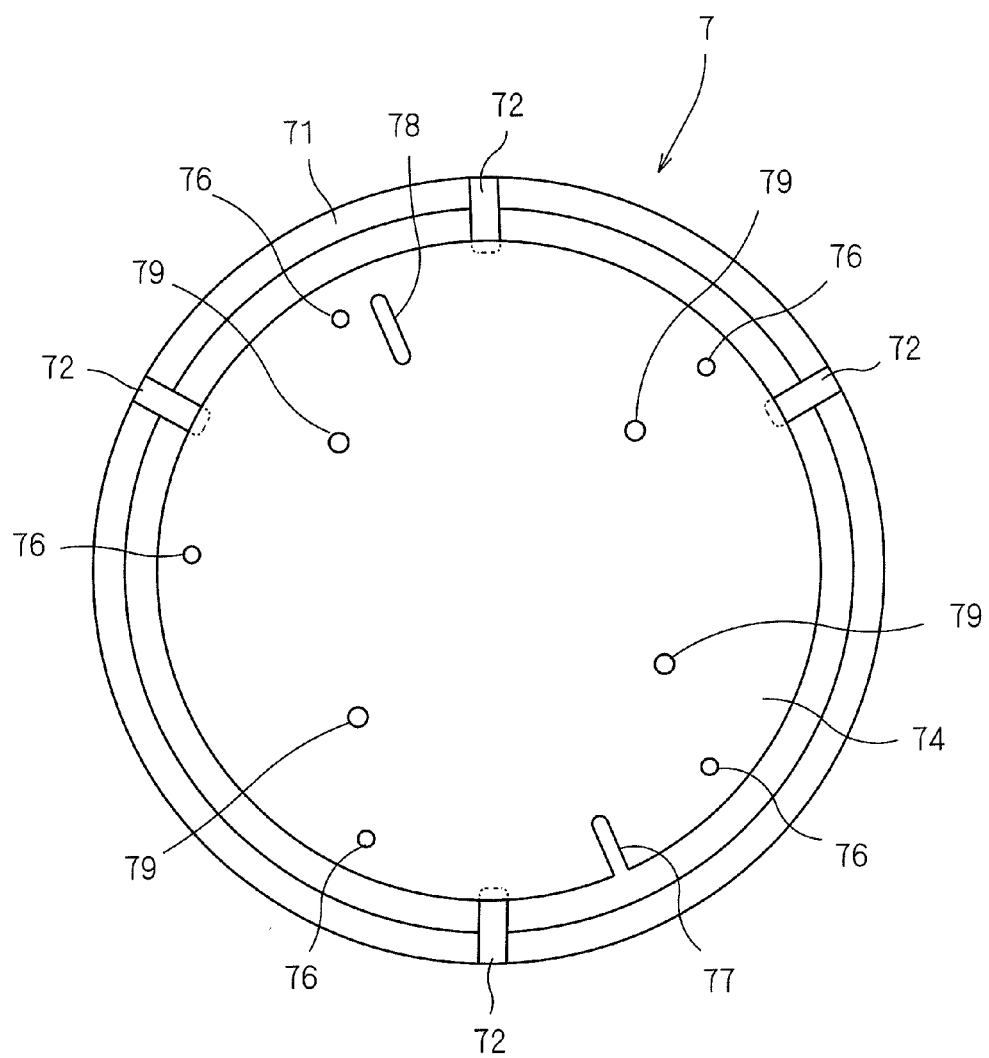
FIG. 3 is a top plan view of the holder.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The planar susceptor 74 is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in this preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal position (a position such that the normal to the susceptor 74 coincides with a vertical direction). A semiconductor wafer W transported into the chamber 6 is placed and held in a horizontal position on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 6:
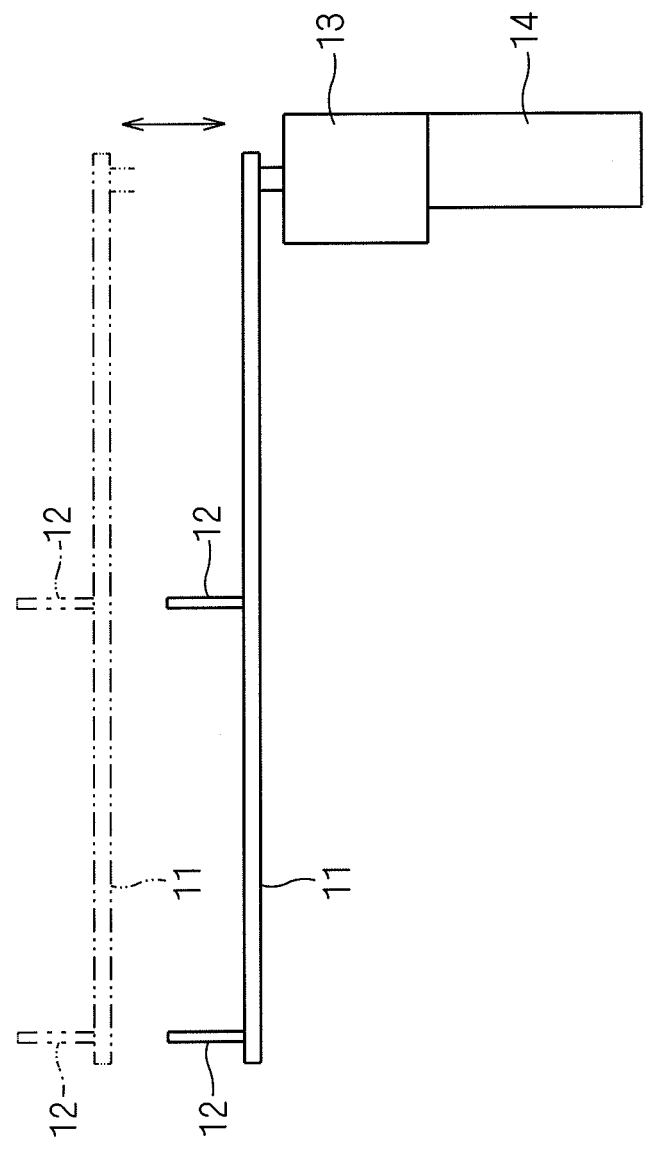
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 8:
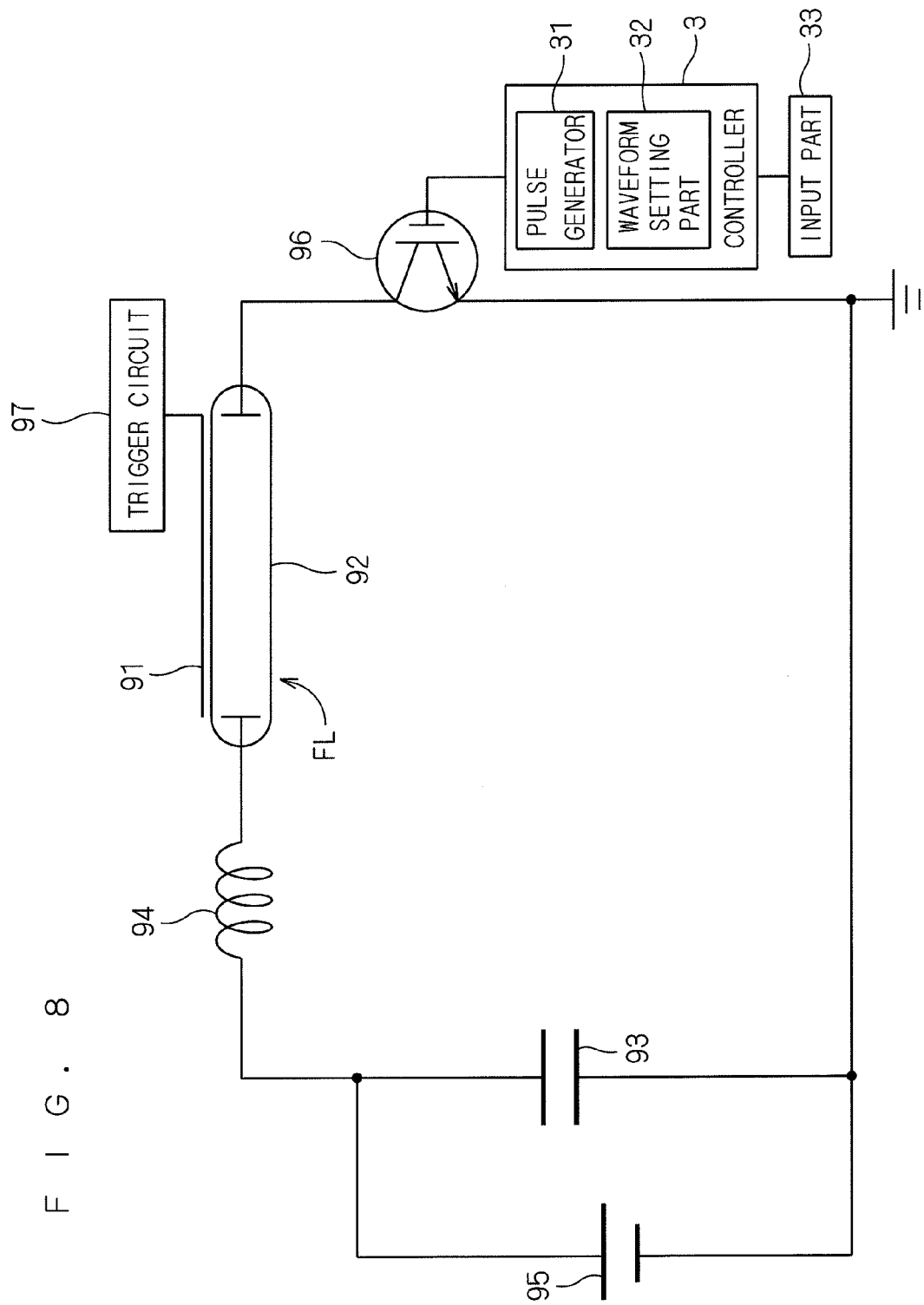
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies the pulse signal to the gate of the IGBT 96. When a voltage ("high" voltage) not less than a predetermined level is applied to the gate of the IGBT 96, the IGBT 96 turns on. When a voltage ("low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, if the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

The reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon.

The multiple (in this preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In this preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals near the ends of the lamp arrangement than in the central portion thereof. This allows a greater amount of light to impinge upon the peripheral portion of the semiconductor wafer W where a temperature fall is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation to the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform. The controller 3, the trigger circuit 97, and the IGBT 96 constitute a light emission controller for controlling the emission of light from each flash lamp FL.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities with which the semiconductor substrate W is doped are activated by the heat treatment apparatus 1 performing the process of heating (annealing) the semiconductor wafer W by flash irradiation. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with processing steps.

Subsequently, the gate valve 185 is opened to open the transport opening 66. A transport robot outside the heat treatment apparatus 1 transports an ion-implanted semiconductor wafer W through the transport opening 66 into the heat treatment space 65 in the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal position. The semiconductor wafer W is held on the susceptor 74 so that the ion-implanted surface thereof is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the back surface of the semiconductor wafer W. The semiconductor wafer W is irradiated with the halogen light from the halogen lamps HL, so that the temperature of the semiconductor wafer W rises. It should be noted that the transfer arms 11 of the transfer mechanism 10, which are retracted to the inside of the recessed portion 62, do not become an obstacle to the heating using the halogen lamps HL.

Figure 9:
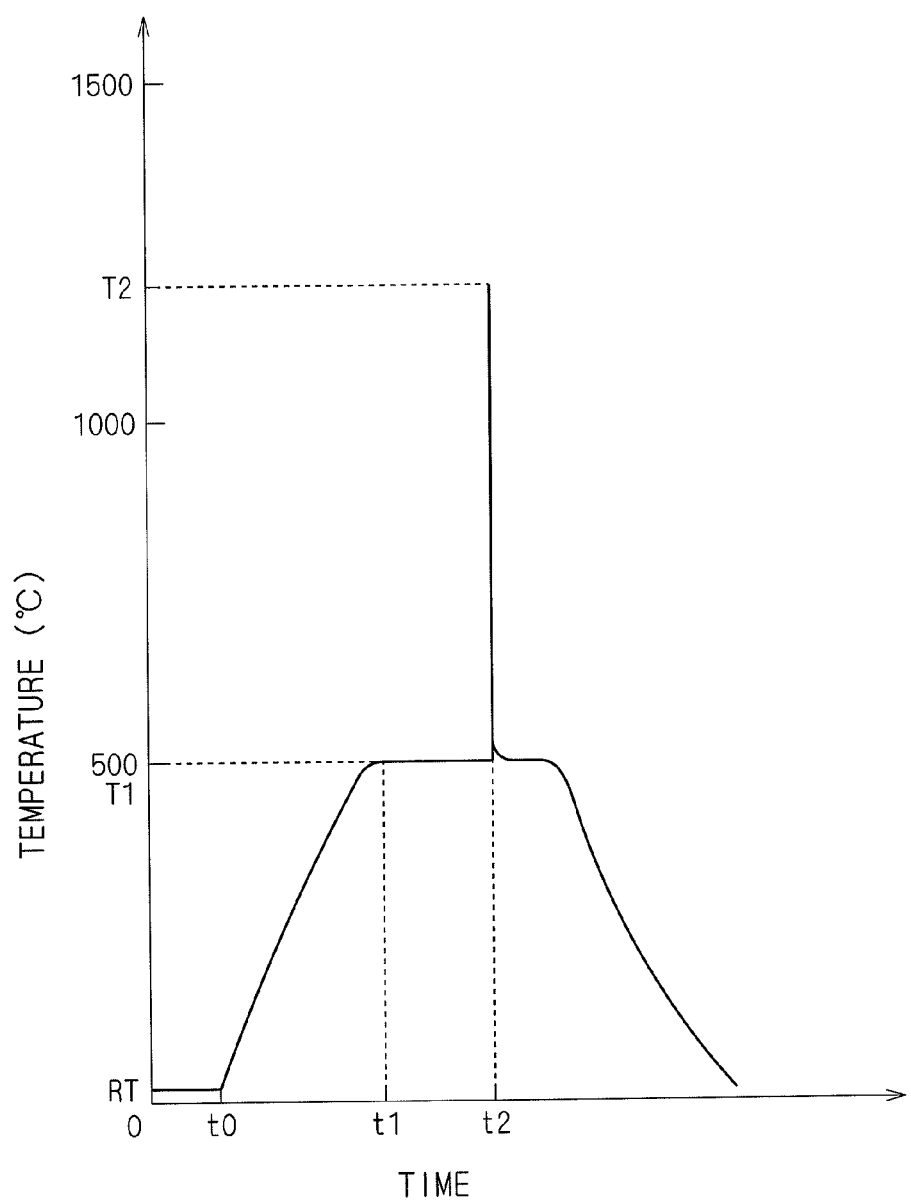
FIG. 9 is a graph showing changes in the temperature of the front surface of a semiconductor wafer.

FIG. 9 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0, so that the temperature of the semiconductor wafer W irradiated with the halogen light is raised to a preheating temperature T1 of not more than 800° C. (in this preferred embodiment, 500° C.). The temperature of the semiconductor wafer W is measured with the contact-type thermometer 130 and the radiation thermometer 120. The temperature of the semiconductor wafer W measured with these thermometers 130 and 120 is transmitted to the controller 3. In other words, the controller 3 effects feedback control of the output from the halogen lamps HL, based on the measurement values of the contact-type thermometer 130 and the radiation thermometer 120, so that the temperature of the semiconductor wafer W is equal to the preheating temperature T1.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 and the radiation thermometer 120 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly raised to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in a region opposed to the peripheral portion of the semiconductor wafer W than in a region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform flash heating at time t2 when a predetermined time period has elapsed since the temperature of the semiconductor wafer W reached the preheating temperature T1. It should be noted that a time interval between the time t1 when the temperature of the semiconductor wafer W reaches the preheating temperature T1 and the time t2 when the flash lamps FL emit light is only on the order of several seconds. For the flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off. In the first preferred embodiment, the connection between the capacitor 93 and the flash lamp FL is made and broken by driving the IGBT 96 on and off, whereby the flash lamp FL emits light twice, i.e. performs the flash irradiation twice.

Figures 10, 11:
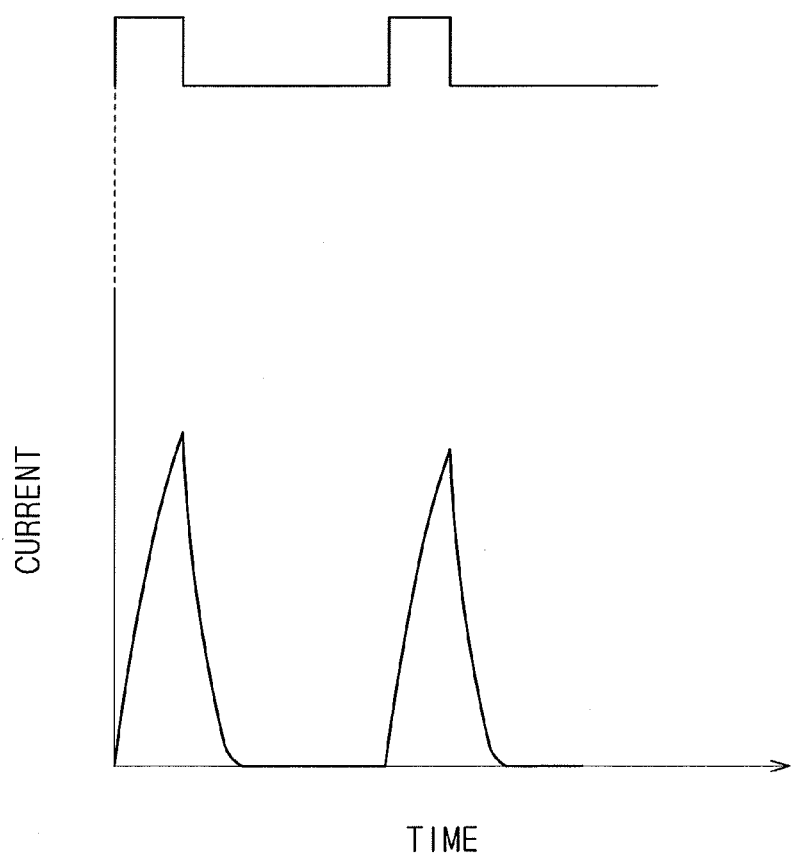
FIG. 10 shows an example of a recipe inputted from an input part according to a first preferred embodiment of the present invention.
FIG. 11 is a graph showing a correlation between the waveform of a pulse signal and a current flowing through the circuit.

The waveform of the pulse signal outputted from the pulse generator 31 is specified by inputting from the input part 33 a recipe that is a sequence of defined parameters including a time interval (ON time) equivalent to the pulse width and a time interval (OFF time) between pulses. FIG. 10 shows an example of such a recipe inputted from the input part 33 according to the first preferred embodiment. In the example of the recipe shown in FIG. 10, two steps corresponding to the two times of the flash irradiation are defined. In the first step, the ON time of one millisecond (equal to 1000 microseconds) and the OFF time of three milliseconds are defined. In the second step, the ON time of 0.9 millisecond is defined. The OFF time is not defined in the second step because the flash irradiation in the second step corresponds to the final iteration of light emission, so that the OFF time need not be particularly defined (although an arbitrary value may be appropriately defined).

After an operator inputs the recipe containing descriptions of such parameters as shown in FIG. 10 from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32. As a result, the pulse signal having the waveform including the repeated ON and OFF time intervals is applied to the gate of the IGBT 96, so that driving the IGBT 96 on and off is controlled.

FIG. 11 is a graph showing a correlation between the waveform of the pulse signal and a current flowing through the circuit. The upper part of FIG. 11 shows the waveform of the pulse signal outputted from the pulse generator 31, and the lower part of FIG. 11 shows the waveform of the current flowing through the circuit of FIG. 8 including the flash lamp FL. When the recipe as shown in FIG. 10 is inputted from the input part 33 to the controller 3, the waveform setting part 32 sets the waveform as shown in the upper part of FIG. 11, and the pulse signal having such a waveform is outputted from the pulse generator 31. A first pulse having a width of one millisecond corresponding to the first time of the flash irradiation (the first flash irradiation), and a second pulse having a width of 0.9 millisecond corresponding to the second time of the flash irradiation (the second flash irradiation) are set in the pulse waveform shown in the upper part of FIG. 11. A time interval between the first pulse and the second pulse is three milliseconds. The pulse signal having the waveform as shown in the upper part of FIG. 11 is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal for each turning on of the pulse signal outputted from the pulse generator 31, the controller 3 controls the trigger circuit 97 to apply a high voltage (trigger voltage) to the trigger electrode 91. When the first pulse is inputted to the gate of the IGBT 96, with the electrical charges stored in the capacitor 93, and the high voltage is applied to the trigger electrode 91 in synchronism with the input of the first pulse, then a current starts flowing across the electrodes of the glass tube 92 of the flash lamp FL, and the resultant excitation of xenon atoms or molecules induces light emission, whereby the first flash irradiation is performed. After one millisecond, the first pulse goes off. Then, the value of the current flowing in the glass tube 92 of the flash lamp FL decreases, and the flash lamp FL completely turns off temporarily. In other words, the irradiation time period of the flash lamp FL for the first flash irradiation is one millisecond which is equal to the ON time of the first pulse.

After three milliseconds following the turning off of the first pulse, the second pulse is inputted to the gate of the IGBT 96. In synchronism with the input of the second pulse, a high voltage is applied to the trigger electrode 91. Then, a current starts flowing again across the electrodes of the glass tube 92, whereby the second flash irradiation from the flash lamp FL is performed. After 0.9 millisecond, the second pulse goes off. Then, the value of the current flowing in the glass tube 92 decreases, and the flash lamp FL turns off again. In other words, the irradiation time period of the flash lamp FL for the second flash irradiation is 0.9 millisecond which is equal to the ON time of the second pulse. In this manner, the current having the waveform as shown in the lower part of FIG. 11 flows to the flash lamp FL, so that the flash lamp FL emits light twice. It should be noted that an individual current waveform corresponding to each pulse is defined by the constant of the coil 94.

The light emission output from the flash lamp FL is roughly proportional to the current flowing through the flash lamp FL. Thus, the output waveform (profile) of the light emission output from the flash lamp FL has a pattern similar to that of the current waveform shown in the lower part of FIG. 11. The flash irradiation is performed on the semiconductor wafer W placed on the susceptor 74 of the holder 7 in accordance with the output waveform from the flash lamp FL similar to that shown in the lower part of FIG. 11.

FIG. 12 is an enlarged graph of a portion of FIG. 9 showing the flash heating and its surroundings (around the time t2). In FIG. 12, the temperature of the front surface of the semiconductor wafer W is indicated by solid lines, and the temperature of the back surface thereof is indicated by broken lines. In the stage of preheating using the halogen lamps HL, the whole of the semiconductor wafer W is uniformly heated, so that the temperatures of both the front and back surfaces are raised to the same preheating temperature T1. When the first pulse is inputted to the gate of the IGBT 96 at time t21 and the high voltage is applied to the trigger electrode 91 in synchronism with the input of the first pulse, the first flash irradiation from the flash lamp FL is performed. This first flash irradiation causes the temperature of the front surface of the semiconductor wafer W to momentarily rise to a treatment temperature T2 of not less than 1000° C. (in this preferred embodiment, 1200° C.). On the other hand, the temperature of the back surface at that instant does not rise so high. In other words, a temperature difference arises momentarily between the front and back surfaces of the semiconductor wafer W.

Such a temperature difference between the front and back surfaces of the semiconductor wafer W which arises at the time of the flash irradiation disappears in a short time because of heat conduction from the front surface to the back surface. Specifically, heat conduction occurs from the front surface of the semiconductor wafer W momentarily raised in temperature toward the back surface thereof. This causes the temperature of the front surface to fall rapidly, and causes the temperature of the back surface to rise slightly. Then, the temperature of the front surface of the semiconductor wafer W and the temperature of the back surface thereof become equal to each other in a short time. In the case of a semiconductor wafer W, for example, having a diameter of 300 mm and a thickness of 0.775 mm, the time required between the instant of the flash irradiation and the instant at which the temperatures of the front and back surfaces thereof become equal to each other is approximately 15 milliseconds.

In the first preferred embodiment, after the first flash irradiation is performed at the time t21 and before the temperatures of the front and back surfaces of the semiconductor wafer W become equal to each other, the second pulse is inputted to the gate of the IGBT 96 at time t22, and the high voltage is applied to the trigger electrode 91 in synchronism with the input of the second pulse, whereby the second flash irradiation from the flash lamp FL is performed. This second flash irradiation causes the temperature of the front surface of the semiconductor wafer W to momentarily rise again to the treatment temperature T2. After the second flash irradiation, heat conduction occurs again from the front surface of the semiconductor wafer W toward the back surface thereof. At time t23, the temperatures of the front and back surfaces of the semiconductor wafer W become equal to each other. It should be noted that the graph of FIG. 9 is plotted with a time scale of seconds, whereas the graph of FIG. 12 is plotted with a time scale of milliseconds. Thus, the times t21 to t23 are shown as overlaid on the time t2 in FIG. 9.

Such two iterations of the flash irradiation achieve the activation of the impurities implanted in the semiconductor wafer W while suppressing the diffusion of the impurities due to heat. Referring again to FIG. 9, the halogen lamps HL turn off after a lapse of a predetermined time period since the completion of the second flash irradiation. This causes the temperature of the semiconductor wafer W to start falling. At the same time that the halogen lamps HL turn off, the shutter mechanism 2 inserts the shutter plate 21 into the light shielding position lying between the halogen heating part 4 and the chamber 6. The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the speed at which the temperature of the semiconductor wafer W decreases.

After the temperature of the semiconductor wafer W decreases to a predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the first preferred embodiment, after the first flash irradiation is performed on the semiconductor wafer W to heat the front surface of the semiconductor wafer W and before the temperatures of the front and back surfaces of the semiconductor wafer W become equal to each other, the second flash irradiation is performed on the semiconductor wafer W to reheat the front surface of the semiconductor wafer W. Specifically, the time required between the instant of the flash irradiation and the instant at which the temperatures of the front and back surfaces of the semiconductor wafer W become equal to each other is approximately 15 milliseconds. Thus, within 15 milliseconds after the first flash irradiation, the second flash irradiation is performed to reheat the front surface of the semiconductor wafer W.

If the second flash irradiation is performed after the temperatures of the front and back surfaces of the semiconductor wafer W become equal to each other following the first flash irradiation, the temperature of the front surface at the time of the second flash irradiation is decreased to a considerably low degree because of heat conduction from the front surface to the back surface. Thus, a relatively low degree of attained temperature of the front surface of the semiconductor wafer W is inevitably caused by the second flash irradiation. In the first preferred embodiment, the second flash irradiation is performed before the temperatures of the front and back surfaces of the semiconductor wafer W become equal to each other following the first flash irradiation. This allows the second flash irradiation to be performed before the temperature of the front surface of the semiconductor wafer W falls, thereby increasing the attained temperature of the front surface of the semiconductor wafer W resulting from the second flash irradiation to a degree higher than the above.

As a result, even when the irradiation time period for the second flash irradiation is made shorter than that for the first flash irradiation to reduce the energy consumed during the second flash irradiation as shown in FIG. 10, the attained temperature of the front surface of the semiconductor wafer W resulting from the second flash irradiation reaches the treatment temperature T2 equal to that for the first flash irradiation. This is preferable when electrical charges are supplied from the capacitor 93 with the amounts of stored electrical charges reduced by the first flash irradiation to the flash lamp FL again to perform the second flash irradiation.

Although the flash irradiation is performed twice in the first preferred embodiment, the number of times the flash irradiation is performed is not limited to two, but may be three or more. For example, the flash irradiation is performed three times in the following manner: the flash irradiation is performed twice as described above, and the third flash irradiation is thereafter performed before the temperatures of the front and back surfaces of the semiconductor wafer W become equal to each other.

That is, for n times of the flash irradiation (where n is an integer not less than two), the light emission from the flash lamps FL may be controlled so that the i-th flash irradiation (where i is a positive integer not more than (n−1)) is performed on the semiconductor wafer W to heat the front surface of the semiconductor wafer W and the (i+1)th flash irradiation is thereafter performed to reheat the front surface of the semiconductor wafer W before the temperatures of the front and back surfaces of the semiconductor wafer W become equal to each other. This causes the (i+1)th flash irradiation to be performed before the temperature of the front surface of the semiconductor wafer W falls following the i-th flash irradiation in the case where the flash irradiation is performed n times, thereby improving the efficiency of heating of the front surface of the semiconductor wafer W resulting from each iteration of the flash irradiation even when consumption energy is decreased with the increasing number of times of the flash irradiation. When the time interval between the i-th flash irradiation and the (i+1)th flash irradiation is made shorter than the above, the attained temperature of the front surface resulting from the (i+1)th flash irradiation is higher than that resulting from the i-th flash irradiation. On the other hand, when the aforementioned time interval is made longer than the above, the attained temperature of the front surface resulting from the (i+1)th flash irradiation is lower than that resulting from the i-th flash irradiation. It should be noted that the time interval between the first flash irradiation and the completion of the last (n-th) flash irradiation is less than one second.

Second Preferred Embodiment

Next, a second preferred embodiment according to the present invention will be described. The heat treatment apparatus according to the second preferred embodiment is precisely identical in configuration with that according to the first preferred embodiment. Also, a procedure for the treatment of a semiconductor wafer W according to the second preferred embodiment is generally similar to that according to the first preferred embodiment (with reference to FIG. 9), and includes the process of performing the flash irradiation multiple times.

As in the first preferred embodiment, the flash lamps FL emit a flash of light to perform the flash heating at the time t2 when a predetermined time period has elapsed since the temperature of the semiconductor wafer W reached the preheating temperature T1 by the preheating using the halogen lamps HL. For the flash irradiation from a flash lamp FL, the capacitor 93 is previously placed in the charged state. In this state, the pulse generator 31 in the controller 3 outputs a pulse signal to the IGBT 96 to drive the IGBT 96 on and off. In the second preferred embodiment, the connection between the capacitor 93 and the flash lamp FL is made and broken by driving the IGBT 96 on and off, whereby the flash lamp FL emits light three times, i.e. performs the flash irradiation three times.

Figure 13:
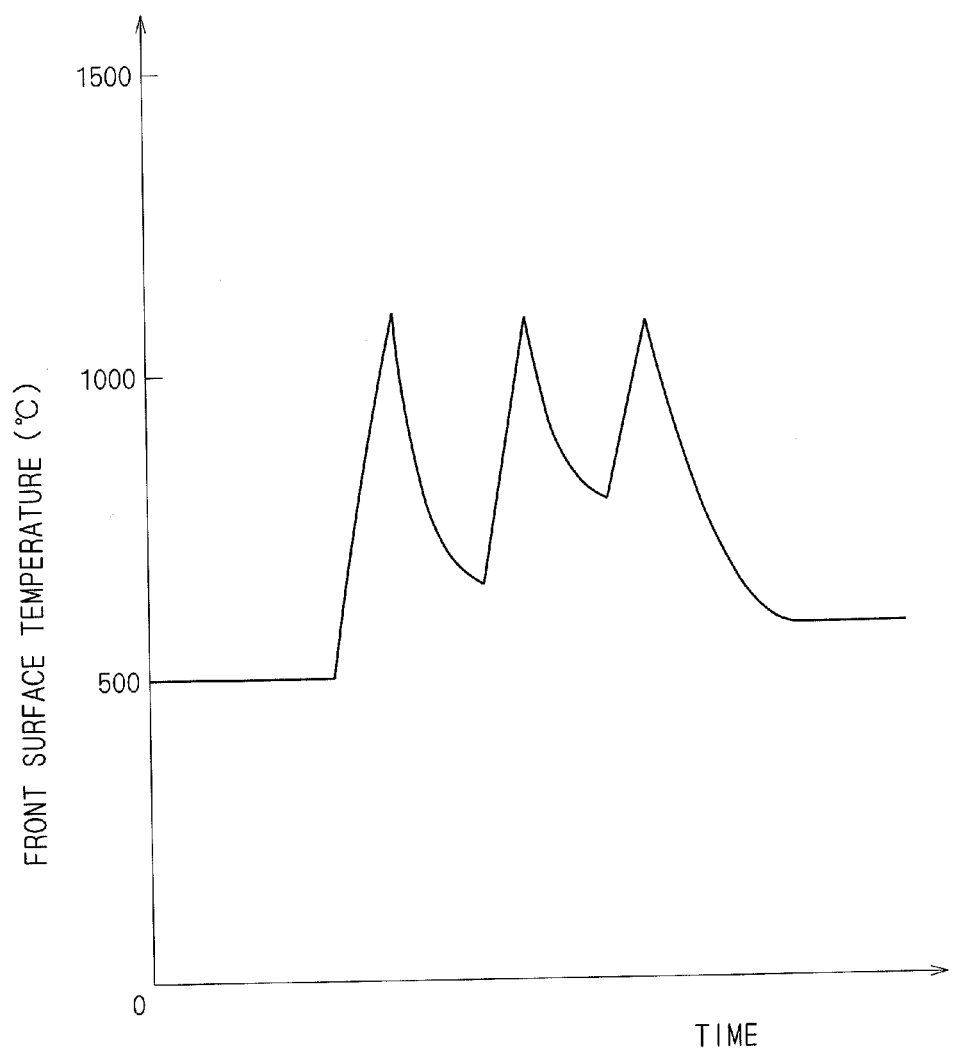
FIG. 13 is a graph showing changes in the temperature of the front surface of a semiconductor wafer when flash irradiation for an irradiation time period of one millisecond is performed there times.

FIG. 13 is a graph showing changes in the temperature of the front surface of the semiconductor wafer W when the irradiation time period of the flash lamp FL for each of the three times of the flash irradiation is one millisecond. Specifically, the ON time of one millisecond in the three steps corresponding to the three times of the flash irradiation is defined (and the OFF time of four milliseconds is defined) in the recipe as shown in FIG. 10, and the recipe is inputted from the input part 33 to the controller 3. Thus, three pulses each having a width of one millisecond are sequentially applied to the gate of the IGBT 96, whereby the IGBT 96 is placed in the ON state for one millisecond repeatedly three times.

Each time the pulse signal outputted from the pulse generator 31 turns on, the controller 3 controls the trigger circuit 97 to apply a high voltage to the trigger electrode 91 in synchronism with the turning on of the pulse signal. As a result, the flash lamp FL emits light three times, so that the flash irradiation for the irradiation time period of one millisecond is repeated three times. When such flash irradiation for the irradiation time period of one millisecond is repeated three times, the attained temperatures of the front surface of the semiconductor wafer W resulting from the three times, respectively, of the flash irradiation are approximately equal to each other, as shown in FIG. 13.

FIG. 14 is a graph showing changes in the temperature of the front surface of a semiconductor wafer W when the irradiation time period of the flash lamp FL for each of the three times of the flash irradiation is 1.4 milliseconds. In a manner similar to that described above, the ON time of 1.4 milliseconds in the three steps corresponding to the three times of the flash irradiation is defined (and the OFF time of four milliseconds is defined) in the recipe as shown in FIG. 10, and the recipe is inputted from the input part 33 to the controller 3. Each time the pulse signal outputted from the pulse generator 31 turns on, the controller 3 controls the trigger circuit 97 to apply a high voltage to the trigger electrode 91 in synchronism with the turning on of the pulse signal. As a result, the flash lamp FL emits light three times, so that the flash irradiation for the irradiation time period of 1.4 milliseconds is repeated three times. When such flash irradiation for the irradiation time period of 1.4 milliseconds is repeated three times, the attained temperature of the front surface of the semiconductor wafer W resulting from the first flash irradiation is high, but the attained temperatures of the front surface of the semiconductor wafer W resulting from the second and subsequent times of the flash irradiation decrease as the number of times of the flash irradiation increases, as shown in FIG. 14.

It is apparent from a comparison between FIGS. 13 and 14 that, although the flash irradiation is performed three times in a similar manner, the attained temperatures of the front surface of the semiconductor wafer W are approximately equal to each other when the irradiation time period is one millisecond, whereas the attained temperatures of the front surface gradually decrease when the irradiation time period is prolonged to 1.4 milliseconds. When the irradiation time period is 1.4 milliseconds, the attained temperature of the front surface of the semiconductor wafer W resulting from the first flash irradiation cannot be maintained by the second flash irradiation and the third flash irradiation. This is because the increase in the irradiation time period increases the consumption energy during single flash irradiation, and the electrical charges stored in the capacitor 93 are accordingly decreased, so that the value of current flowing through the flash lamp FL is significantly reduced during the second and subsequent times of the flash irradiation.

The present inventor has made a diligent study of a correlation between the irradiation time period of the flash lamp FL and the amount of consumption of energy resulting from the electrical charges stored in the capacitor 93 to thereby obtain a result as shown in FIG. 15. The irradiation time period of the flash lamp FL is changed according to the time interval (ON time) equivalent to the pulse width defined in the recipe as shown in FIG. 10. On the other hand, the energy of the electrical charges stored in the capacitor 93 is calculated as $CV^2/2$ where C is the capacitance of the capacitor 93 and V is a voltage resulting from the electrical charges. For each value of the pulse width, the initial charging voltage provided by the power supply unit 95 prior to the flash irradiation shall be 4000 V. Then, the consumed energy is calculated from a difference between the voltage (residual voltage) of the electrical charges remaining in the capacitor 93 at the time of the completion of the single flash irradiation using the defined pulse width and the initial charging voltage, and the amounts of consumption are listed in FIG. 15.

As shown in FIG. 15, 25% of the energy initially stored in the capacitor 93 is consumed during the single flash irradiation when the irradiation time period (the time interval equivalent to the pulse width) is 1.0 millisecond, whereas 40% of the energy initially stored in the capacitor 93 is consumed when the irradiation time period is 1.4 milliseconds. Thus, in the case where the flash irradiation for the irradiation time period of 1.4 milliseconds is performed three times, it is contemplated that sufficient energy does not remain in the capacitor 93, in particular, during later iterations of the flash irradiation, which in turn significantly reduces the value of current flowing through the flash lamp FL and accordingly reduces the emission intensity to result in the low attained temperature of the front surface of the semiconductor wafer W.

In the second preferred embodiment, energy $P_{flash}$ consumed during each iteration of flash irradiation in the case where the flash irradiation is performed n times (where n is an integer not less than two) is specified as:

$$P_{flash} \le \frac{P_{initial}}{n+1} \qquad (1)$$

where $P_{initial}$ is energy initially stored in the capacitor 93 before the initial flash irradiation is performed (i.e., energy immediately after the charging by the power supply unit 95).

According to Expression (1), for two times of the flash irradiation, the energy $P_{flash}$ consumed during the single flash irradiation from the flash lamp FL shall be not more than one-third of the energy $P_{initial}$ stored in the capacitor 93 before the initial flash irradiation is performed. Also, for three times of the flash irradiation, the energy $P_{flash}$ consumed during the single flash irradiation from the flash lamp FL shall be not more than one-fourth of the energy $P_{initial}$ stored in the capacitor 93 before the initial flash irradiation is performed. In summary, for n times of the flash irradiation (where n is an integer not less than two), the energy $P_{flash}$ consumed during the single flash irradiation from the flash lamp FL shall be not more than $1/(n+1)$ of the energy $P_{initial}$ stored in the capacitor 93 before the initial flash irradiation is performed. It should be noted that the time interval between the first flash irradiation and the completion of the last (n-th) flash irradiation is less than one second.

The energy $P_{flash}$ consumed during the single flash irradiation may be adjusted by defining the time interval equivalent to the pulse width in the recipe, based on the table shown in FIG. 15. For example, the time interval equivalent to the pulse width may be not more than 1.2 milliseconds so as to achieve the energy $P_{flash}$ consumed during the single flash irradiation which is not more than one-third of the initial energy $P_{initial}$. Also, the time interval equivalent to the pulse width may be not more than 1.0 millisecond so as to achieve the energy $P_{flash}$ consumed during the single flash irradiation which is not more than one-fourth of the initial energy $P_{initial}$. The recipe in which such a pulse width is defined is inputted from the input part 33 to the controller 3, whereby a pulse having the pulse width is inputted to the gate of the IGBT 96. This places the IGBT 96 in the ON state for a time period equivalent to the pulse width to make and break the connection between the capacitor 93 and the flash lamp FL.

Such a method secures minimum energy required for each iteration of the flash irradiation in the case where the flash irradiation is performed n times to improve the efficiency of heating of the front surface of the semiconductor wafer W resulting from each iteration of the flash irradiation throughout the n times of the flash irradiation.

Third Preferred Embodiment

Next, a third preferred embodiment according to the present invention will be described. The heat treatment apparatus according to the third preferred embodiment is precisely identical in configuration with that according to the first preferred embodiment. Also, a procedure for the treatment of a semiconductor wafer W according to the third preferred embodiment is generally similar to that according to the first preferred embodiment (with reference to FIG. 9), and includes the process of performing the flash irradiation multiple times.

As in the first preferred embodiment, the flash lamps FL emit a flash of light to perform the flash heating at the time t2 when a predetermined time period has elapsed since the temperature of the semiconductor wafer W reached the preheating temperature T1 by the preheating using the halogen lamps HL. For the flash irradiation from a flash lamp FL, the capacitor 93 is previously placed in the charged state. In this state, the pulse generator 31 in the controller 3 outputs a pulse signal to the IGBT 96 to drive the IGBT 96 on and off. In the third preferred embodiment, the connection between the capacitor 93 and the flash lamp FL is made and broken by driving the IGBT 96 on and off, whereby the flash lamp FL emits light three times, i.e. performs the flash irradiation three times.

FIG. 16 shows an example of the recipe for use according to the third preferred embodiment. In the example according to the third preferred embodiment, three steps corresponding to the three times of the flash irradiation are defined. In the first step, the ON time of 1.15 milliseconds (equal to 1150 microseconds) and the OFF time of four milliseconds are defined. In the second step, the ON time of 1.2 milliseconds and the OFF time of four milliseconds are defined. In the third step, the ON time of 1.4 milliseconds is defined. The OFF time is not defined in the third step corresponds to the final iteration because the OFF time need not be particularly defined, as in the aforementioned example shown in FIG. 10.

After an operator inputs the recipe containing descriptions of such parameters as shown in FIG. 16 from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32 to drive the IGBT 96 on and off. Each time the pulse signal outputted from the pulse generator 31 turns on, the controller 3 controls the trigger circuit 97 to apply a high voltage to the trigger electrode 91 in synchronism with the turning on of the pulse signal. As a result, the IGBT 96 which is driven on and off makes and breaks the connection between the capacitor 93 and the flash lamp FL to control the light emission from the flash lamp FL.

In the third preferred embodiment, the flash irradiation is performed three times, and the irradiation time period of the flash lamp FL for each of the three times of the flash irradiation is equal to the ON time in each of the steps. In the third preferred embodiment, as shown in FIG. 16, the irradiation time period (1.2 milliseconds) for the second flash irradiation is longer than the irradiation time period (1.15 milliseconds) for the first flash irradiation. Also, the irradiation time period (1.4 milliseconds) for the third flash irradiation is longer than the irradiation time period (1.2 milliseconds) for the second flash irradiation.

Figure 17:
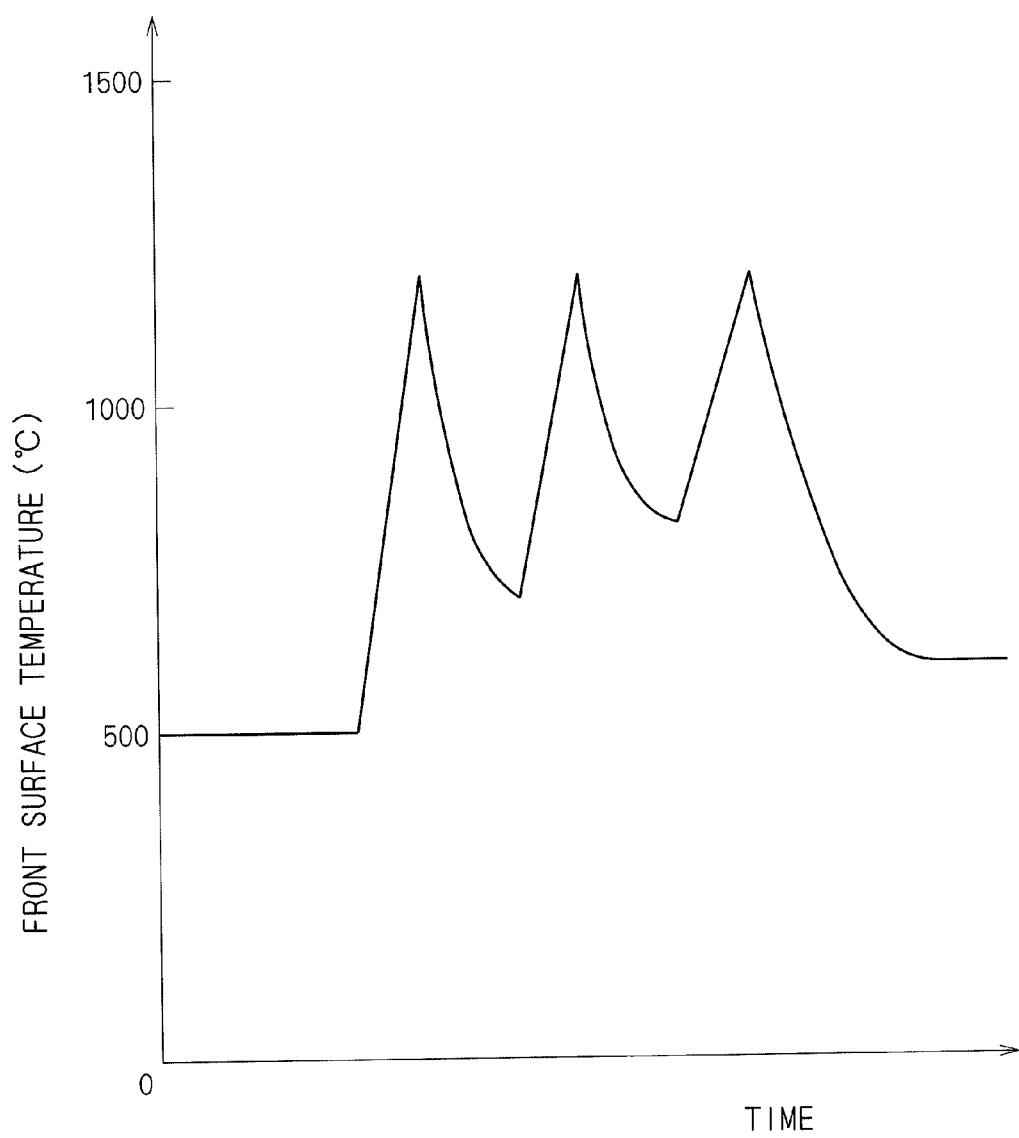
FIG. 17 is a graph showing changes in the temperature of the front surface of a semiconductor wafer according to the third preferred embodiment.

FIG. 17 is a graph showing changes in the temperature of the front surface of the semiconductor wafer W according to the third preferred embodiment. The IGBT 96 is driven on and off using the pulse signal generated based on the recipe shown in FIG. 16 to control the emission of light from the flash lamp FL so that the later the iteration of the flash irradiation is, the longer the irradiation time period becomes, whereby the attained temperatures of the front surface of the semiconductor wafer W resulting from the three times, respectively, of the flash irradiation are approximately equal to each other, as shown in FIG. 17. The reason therefor is as follows. The flash irradiation performed multiple times is controlled so that the later the iteration is, the longer the irradiation time period (ON time) becomes, whereby more energy remaining in the capacitor 93 which is reduced by being consumed in the prior iteration can be extracted. This secures minimum energy required even for the second and subsequent iterations of the flash irradiation to improve the efficiency of heating of the front surface of the semiconductor wafer W resulting from each iteration of the flash irradiation.

Thus, for n times of the flash irradiation (where n is an integer not less than two), the light emission from the flash lamps FL according to the third preferred embodiment is controlled so that the i-th flash irradiation (where i is a positive integer not more than (n−1)) is performed on the semiconductor wafer W for an irradiation time period $t_i$ and the (i+1)th flash irradiation is thereafter performed for an irradiation time period $t_{(i+1)}$ that is longer than the irradiation time period $t_i$. This makes the irradiation time period longer for the later one of the n iterations of the flash irradiation, to achieve the extraction of more energy remaining in the capacitor 93 which is reduced by being consumed in the prior iteration, thereby improving the efficiency of heating of the front surface of the semiconductor wafer W resulting from each iteration of the flash irradiation. It should be noted that the time interval between the first flash irradiation and the completion of the last (n-th) flash irradiation is less than one second.

Fourth Preferred Embodiment

Next, a fourth preferred embodiment according to the present invention will be described. The heat treatment apparatus according to the fourth preferred embodiment is precisely identical in configuration with that according to the first preferred embodiment. Also, a procedure for the treatment of a semiconductor wafer W according to the fourth preferred embodiment is generally similar to that according to the first preferred embodiment (with reference to FIG. 9), and includes the process of performing the flash irradiation multiple times (in the fourth preferred embodiment, at least three times or more).

As in the first preferred embodiment, the flash lamps FL emit a flash of light to perform the flash heating at the time t2 when a predetermined time period has elapsed since the temperature of the semiconductor wafer W reached the preheating temperature T1 by the preheating using the halogen lamps HL. For the flash irradiation from a flash lamp FL, the capacitor 93 is previously placed in the charged state. In this state, the pulse generator 31 in the controller 3 outputs a pulse signal to the IGBT 96 to drive the IGBT 96 on and off. In the fourth preferred embodiment, the connection between the capacitor 93 and the flash lamp FL is made and broken by driving the IGBT 96 on and off, whereby the flash lamp FL emits light three times, i.e. performs the flash irradiation three times.

FIG. 18 shows an example of the recipe for use according to the fourth preferred embodiment. In the example according to the fourth preferred embodiment, three steps corresponding to the three times of the flash irradiation are defined. In the first step, the ON time of 1.2 milliseconds (equal to 1200 microseconds) and the OFF time of four milliseconds are defined. In the second step, the ON time of 1.2 milliseconds and the OFF time of 1.5 milliseconds are defined. In the third step, the ON time of 1.2 milliseconds is defined. The OFF time is not defined in the third step corresponds to the final iteration because the OFF time need not be particularly defined, as in the aforementioned example shown in FIG. 10.

After an operator inputs the recipe containing descriptions of such parameters as shown in FIG. 18 from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32 to drive the IGBT 96 on and off. Each time the pulse signal outputted from the pulse generator 31 turns on, the controller 3 controls the trigger circuit 97 to apply a high voltage to the trigger electrode 91 in synchronism with the turning on of the pulse signal. As a result, the IGBT 96 which is driven on and off makes and breaks the connection between the capacitor 93 and the flash lamp FL to control the light emission from the flash lamp FL. Specifically, the electrical charges stored in the capacitor 93 are discharged through the flash lamp FL, whereby the first flash irradiation is performed on the semiconductor wafer W. Thereafter, the electrical charges remaining in the capacitor 93 are discharged through the flash lamp FL, whereby the second flash irradiation is performed. Thereafter, the electrical charges remaining in the capacitor 93 are further discharged by the flash lamp FL, whereby the third flash irradiation is performed.

In the fourth preferred embodiment, the flash irradiation is performed three times in this manner, and the irradiation time period of the flash lamp FL for each of the three times of flash irradiation is equal to the ON time in each of the steps. The time interval (non-irradiation time period) between the first flash irradiation and the second flash irradiation is equal to the OFF time in the first step, and the time interval (non-irradiation time period) between the second flash irradiation and the third flash irradiation is equal to the OFF time in the second step. In the fourth preferred embodiment, as shown in FIG. 18, the irradiation time periods for the three times, respectively, of the flash irradiation are equal to each other and are 1.2 milliseconds, and the non-irradiation time period (1.5 milliseconds) between the second flash irradiation and the third flash irradiation is shorter than the non-irradiation time period (four milliseconds) between the first flash irradiation and the second flash irradiation.

Figure 19:
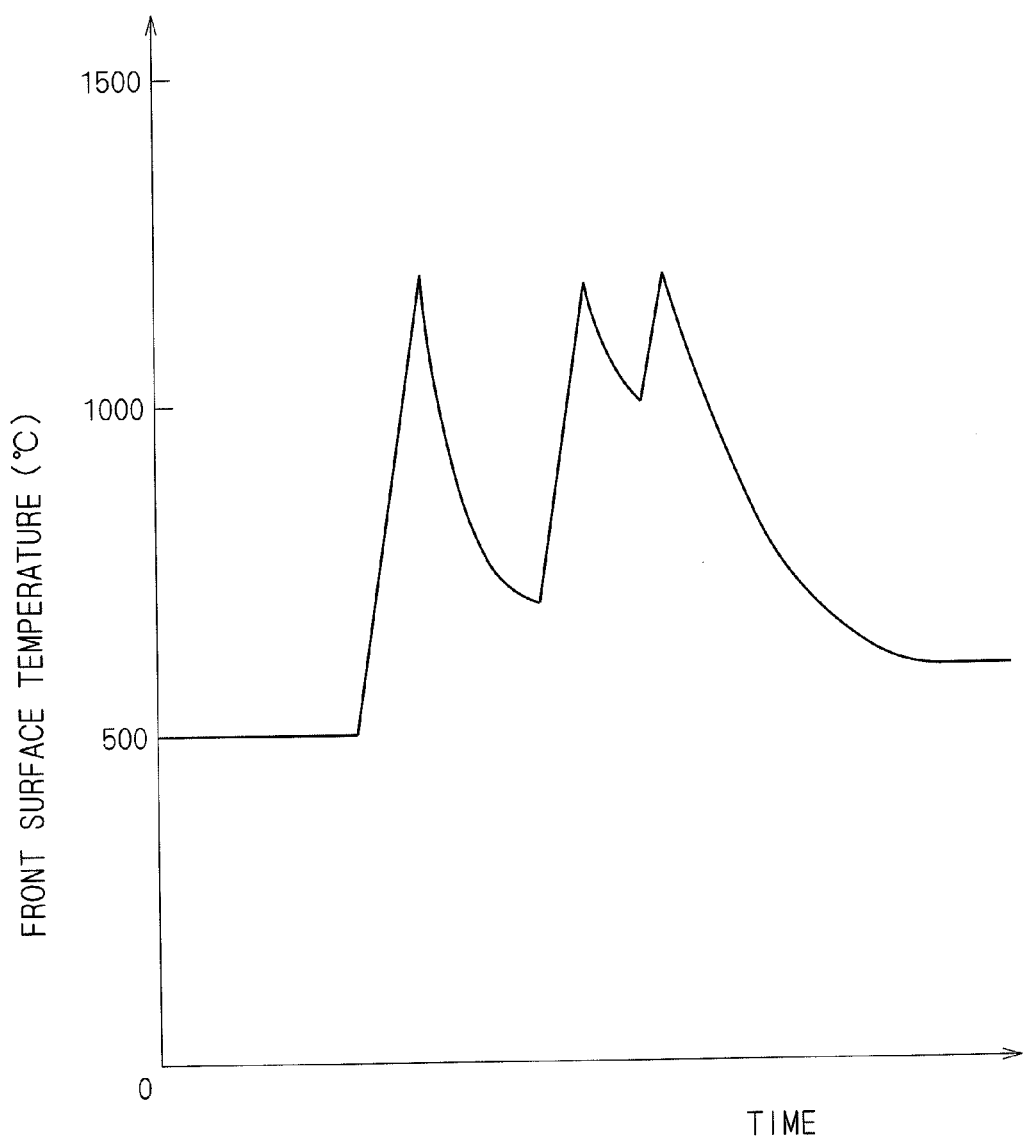
FIG. 19 is a graph showing changes in the temperature of the front surface of a semiconductor wafer according to the fourth preferred embodiment.

FIG. 19 is a graph showing changes in the temperature of the front surface of the semiconductor wafer W according to the fourth preferred embodiment. The IGBT 96 is driven on and off using the pulse signal generated based on the recipe shown in FIG. 18 to control the emission of light from the flash lamp FL so that the later the iteration of the flash irradiation is, the shorter the non-irradiation time period becomes, whereby the attained temperatures of the front surface of the semiconductor wafer W resulting from the three times, respectively, of the flash irradiation are approximately equal to each other, as shown in FIG. 19. The reason therefor is as follows. The flash irradiation performed multiple times is controlled so that the later the iteration is, the shorter the non-irradiation time period (OFF time) becomes. Thus, before the temperature of the front surface of the semiconductor wafer W falls following the flash irradiation, the next flash irradiation is performed. Therefore, even if less energy remains in the capacitor 93 for the later one of the iterations, the efficiency of heating of the front surface of the semiconductor wafer W resulting from each iteration of the flash irradiation is improved.

Thus, for n times of the flash irradiation (where n is an integer not less than three), the light emission from the flash lamps FL according to the fourth preferred embodiment is controlled so that the non-irradiation time period between the (i+1)th flash irradiation (where i is a positive integer not more than (n−2)) and the (i+2)th flash irradiation is shorter than the non-irradiation time period between the i-th flash irradiation and the (i+1)th flash irradiation. This makes the time interval (non-irradiation time period) between successive iterations of the flash irradiation shorter for the later one of the n iterations of the flash irradiation. Thus, before the temperature of the front surface of the semiconductor wafer W falls following the flash irradiation, the next flash irradiation is performed. Therefore, the efficiency of heating of the front surface of the semiconductor wafer W resulting from each iteration of the flash irradiation is improved. It should be noted that the time interval between the first flash irradiation and the completion of the last (n-th) flash irradiation is less than one second.

MODIFICATIONS

While the preferred embodiments according to the present invention have been described hereinabove, various modifications of the present invention in addition to those described above may be made without departing from the scope and spirit of the invention. In the aforementioned preferred embodiments, for example, each time the pulse signal outputted from the pulse generator 31 turns on, a high voltage is applied to the trigger electrode 91 in synchronism with the turning on of the pulse signal. However, the present invention is not limited to this. A high voltage may be applied to the trigger electrode 91 only when the pulse signal initially turns on. In such a case, it is preferable that the IGBT 96 is driven on and off at slight time intervals between the one flash irradiation and the next flash irradiation to produce small flashes repeatedly, thereby causing slight current to continuously flow through the flash lamp FL. This ensures the emission of light from the flash lamp FL during the next flash irradiation. When the time interval (non-irradiation time period) between successive iterations of the flash irradiation is approximately 10 milliseconds or less, there are cases where the flash lamp FL is caused to emit light again only by the IGBT 96 subsequently turning on to make the connection between the capacitor 93 and the flash lamp FL without the continuous flow of the slight current.

Also, when a high voltage is applied to the trigger electrode 91 each time the pulse signal outputted from the pulse generator 31 turns on, the trigger voltage may be applied after a predetermined time period has elapsed since the turning on of the pulse signal for the purpose of ensuring the discharge through the flash lamp FL. In such a case, the irradiation time period of the flash lamp FL is a time interval between the application of the high voltage to the trigger electrode 91 and the turning off of the pulse signal, and is different from that according to the aforementioned preferred embodiments (wherein the irradiation time period is equal to the time interval equivalent to the pulse width). Also, the time interval (non-irradiation time period) between successive iterations of the flash irradiation of the flash lamp FL is a time interval between the turning off of the pulse signal and the application of the trigger voltage corresponding to the next pulse. In other words, the ON time and the OFF time in the recipe do not coincide with the actual irradiation time period and the actual non-irradiation time period of the flash lamp FL. For this reason, the operability of an operator is improved when the ON time defined in the recipe is a time interval between the application of the trigger voltage to the trigger electrode 91 and the turning off of the pulse signal, and the OFF time is a time interval between the turning off of the pulse signal and the application of the trigger voltage corresponding to the next pulse.

Also, the setting of the waveform of the pulse signal is not limited to inputting the parameters including the pulse width and the like one by one from the input part 33. For example, the setting of the waveform may be done by an operator inputting the waveform directly in graphical form from the input part 33, by reading the waveform previously set and stored in a storage part such as a magnetic disk and the like, or by downloading the waveform from outside the heat treatment apparatus 1.

Although the IGBT 96 is used as a switching element in the aforementioned preferred embodiments, another transistor capable of turning on and off the circuit in accordance with the signal level inputted to the gate thereof may be used in place of the IGBT 96. It is, however, preferable to use an IGBT and a GTO (gate turn-off) thyristor which are suitable for handling high power as a switching element because the emission of light from the flash lamps FL consumes considerably high power.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned preferred embodiments, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Moreover, a substrate to be processed or treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with a flash of light n times, where n is an integer not less than two, the method comprising the steps of:
   performing the i-th flash irradiation, where i is a positive integer not more than (n−1), on a substrate to heat a front surface of said substrate; and
   thereafter performing the (i+1)th flash irradiation on said substrate to reheat the front surface of said substrate before the temperature of the front surface of said substrate becomes equal to the temperature of a back surface of said substrate,
   wherein the i-th flash irradiation is performed by discharging electrical charges stored in a capacitor through a flash lamp, and
   the (i+1)th flash irradiation is performed by discharging electrical charges remaining in said capacitor through said flash lamp, wherein
   energy consumed during single flash irradiation from said flash lamp is not more than a value obtained by dividing energy stored in said capacitor prior to the initial flash irradiation by (n+1).

2. The method according to claim 1, wherein
   the i-th flash irradiation is performed on the substrate for a first irradiation time period, and the (i+1)th flash irradiation is thereafter performed on the substrate for a second irradiation time period longer than the first irradiation time period.

3. The method according to claim 1, wherein
   n is an integer not less than three, and
   a first non-irradiation time period is shorter than a second non-irradiation time period, the second non-irradiation time period being a time period between performing the i-th flash irradiation, where i is a positive integer not more than (n−2), on the substrate by discharging electrical charges stored in the capacitor through the flash lamp and performing the (i+1)th flash irradiation on the substrate by discharging electrical charges remaining in said capacitor through said flash lamp, the first non-irradiation time period being a time period between performing the (i+1)th flash irradiation and performing the (i+2)th flash irradiation on the substrate by further discharging electrical charges remaining in said capacitor through said flash lamp.

4. A heat treatment apparatus for heating a substrate by irradiating the substrate with a flash of light n times, where n is an integer not less than two, the heat treatment apparatus comprising:
   a chamber for receiving a substrate therein;
   a holder for holding the substrate within said chamber;
   a flash lamp for irradiating the substrate held by said holder with a flash of light;
   a capacitor for storing electrical charges for emission of light from said flash lamp; and
   a light emission controller for making and breaking a connection between said capacitor and said flash lamp to control the emission of light from said flash lamp, said light emission controller being configured to control the emission of light from said flash lamp so that the i-th flash irradiation, where i is a positive integer not more than (n−1), is performed from said flash lamp to heat a front surface of said substrate and so that the (i+1)th flash irradiation is thereafter performed to reheat the front surface of the substrate before the temperature of the front surface of said substrate becomes equal to the temperature of a back surface of said substrate, wherein said light emission controller is configured to make and break the connection between said capacitor and said flash lamp so that energy consumed during single flash irradiation from said flash lamp is not more than a value obtained by dividing energy stored in said capacitor prior to the initial flash irradiation by (n+1).

5. The heat treatment apparatus according to claim 4, wherein
said light emission controller includes a switching element connected in series with said flash lamp, said capacitor, and a coil.

6. The heat treatment apparatus according to claim 5, wherein
said switching element is an insulated-gate bipolar transistor.

7. A method of heating a substrate by irradiating the substrate with a flash of light n times, where n is an integer not less than two, the method comprising the step of
determining energy consumed during single flash irradiation from a flash lamp by discharging electrical charges stored in a capacitor through the flash lamp as not more than a value obtained by dividing energy stored in said capacitor prior to the initial flash irradiation by (n+1).

8. The method according to claim 7, wherein
the i-th flash irradiation, where i is a positive integer not more than (n−1), is performed on the substrate for a first irradiation time period by discharging electrical charges stored in the capacitor through the flash lamp, and the (i+1)th flash irradiation is thereafter performed on the substrate for a second irradiation time period longer than the first irradiation time period by discharging electrical charges remaining in said capacitor through said flash lamp.

9. The method according to claim 7, wherein
n is an integer not less than three, and
a first non-irradiation time period is shorter than a second non-irradiation time period, the second non-irradiation time period being a time period between performing the i-th flash irradiation, where i is a positive integer not more than (n−2), on the substrate by discharging electrical charges stored in the capacitor through the flash lamp and performing the (i+1)th flash irradiation on the substrate by discharging electrical charges remaining in said capacitor through said flash lamp, the first non-irradiation time period being a time period between performing the (i+1)th flash irradiation and performing the (i+2)th flash irradiation on the substrate by further discharging electrical charges remaining in said capacitor through said flash lamp.

10. A heat treatment apparatus for heating a substrate by irradiating the substrate with a flash of light n times, where n is an integer not less than two, the heat treatment apparatus comprising:
a chamber for receiving a substrate therein;
a holder for holding the substrate within said chamber;
a flash lamp for irradiating the substrate held by said holder with a flash of light;
a capacitor for storing electrical charges for emission of light from said flash lamp; and
a light emission controller for making and breaking a connection between said capacitor and said flash lamp to control the emission of light from said flash lamp, said light emission controller being configured to make and break the connection between said capacitor and said flash lamp so that energy consumed during single flash irradiation from said flash lamp is not more than a value obtained by dividing energy stored in said capacitor prior to the initial flash irradiation by (n+1).

11. The heat treatment apparatus according to claim 10, wherein
said light emission controller is configured to control the emission of light from said flash lamp so that the i-th flash irradiation, where i is a positive integer not more than (n−1), is performed on the substrate for a first irradiation time period, and so that the (i+1)th flash irradiation is thereafter performed on the substrate for a second irradiation time period longer than the first irradiation time period.

12. The heat treatment apparatus according to claim 10, wherein
n is an integer not less than three, and
said light emission controller is configured to control the emission of light from said flash lamp so that a first non-irradiation time period is shorter than a second non-irradiation time period, the second non-irradiation time period being a time period between performing the i-th flash irradiation, where i is a positive integer not more than (n−2), from said flash lamp and performing the (i+1)th flash irradiation, the first non-irradiation time period being a time period between performing the (i+1)th flash irradiation and performing the (i+2)th flash irradiation.

13. The heat treatment apparatus according to claim 10, wherein
said light emission controller includes a switching element connected in series with said flash lamp, said capacitor, and a coil.

14. The heat treatment apparatus according to claim 13, wherein
said switching element is an insulated-gate bipolar transistor.

15. A method of heating a substrate by irradiating the substrate with a flash of light n times, where n is an integer not less than two, the method comprising the steps of:
performing the i-th flash irradiation, where i is a positive integer not more than (n−1), on the substrate for a first irradiation time period by discharging electrical charges stored in a capacitor through a flash lamp; and
thereafter performing the (i+1)th flash irradiation on said substrate for a second irradiation time period longer than the first irradiation time period by discharging electrical charges remaining in said capacitor through said flash lamp.

16. The method according to claim 15, wherein
n is an integer not less than three, and
a first non-irradiation time period is shorter than a second non-irradiation time period, the second non-irradiation time period being a time period between performing the i-th flash irradiation, where i is a positive integer not more than (n−2), on the substrate by discharging electrical charges stored in the capacitor through the flash lamp and performing the (i+1)th flash irradiation on the substrate by discharging electrical charges remaining in said capacitor through said flash lamp, the first non-irradiation time period being a time period between performing the (i+1)th flash irradiation and performing the (i+2)th flash irradiation on the substrate by further discharging electrical charges remaining in said capacitor through said flash lamp.

17. A heat treatment apparatus for heating a substrate by irradiating the substrate with a flash of light n times, where n is an integer not less than two, the heat treatment apparatus comprising:
a chamber for receiving a substrate therein;
a holder for holding the substrate within said chamber;
a flash lamp for irradiating the substrate held by said holder with a flash of light;
a capacitor for storing electrical charges for emission of light from said flash lamp; and
a light emission controller for making and breaking a connection between said capacitor and said flash lamp to control the emission of light from said flash lamp, said light emission controller being configured to control the emission of light from said flash lamp so that the i-th flash irradiation, where i is a positive integer not more than (n−1), is performed on the substrate for a first irradiation time period, and so that the (i+1)th flash irradiation is thereafter performed on the substrate for a second irradiation time period longer than the first irradiation time period.

18. The heat treatment apparatus according to claim 17, wherein
n is an integer not less than three, and
said light emission controller is configured to control the emission of light from said flash lamp so that a first non-irradiation time period is shorter than a second non-irradiation time period, the second non-irradiation time period being a time period between performing the i-th flash irradiation, where i is a positive integer not more than (n−2), from said flash lamp and performing the (i+1)th flash irradiation, the first non-irradiation time period being a time period between performing the (i+1)th flash irradiation and performing the (i+2)th flash irradiation.

19. The heat treatment apparatus according to claim 17, wherein
said light emission controller includes a switching element connected in series with said flash lamp, said capacitor, and a coil.

20. The heat treatment apparatus according to claim 19, wherein
said switching element is an insulated-gate bipolar transistor.

21. A method of heating a substrate by irradiating the substrate with a flash of light n times, where n is an integer not less than three, the method comprising the steps of:

(a) performing the i-th flash irradiation, where i is a positive integer not more than (n−2), on a substrate by discharging electrical charges stored in a capacitor through a flash lamp;
(b) thereafter performing the (i+1)th flash irradiation on the substrate by discharging electrical charges remaining in said capacitor through said flash lamp; and
(c) thereafter performing the (i+2)th flash irradiation on the substrate by further discharging electrical charges remaining in said capacitor through said flash lamp,
wherein a first non-irradiation time period is shorter than a second non-irradiation time period, the second non-irradiation time period being a time period between said step (a) and said step (b), the first non-irradiation time period being a time period between said step (b) and said step (c).

22. A heat treatment apparatus for heating a substrate by irradiating the substrate with a flash of light n times, where n is an integer not less than three, the heat treatment apparatus comprising:
a chamber for receiving a substrate therein;
a holder for holding the substrate within said chamber; a flash lamp for irradiating the substrate held by said holder with a flash of light;
a capacitor for storing electrical charges for emission of light from said flash lamp; and
a light emission controller for making and breaking a connection between said capacitor and said flash lamp to control the emission of light from said flash lamp, said light emission controller being configured to control the emission of light from said flash lamp so that a first non-irradiation time period is shorter than a second non-irradiation time period, the second non-irradiation time period being a time period between performing the i-th flash irradiation, where i is a positive integer not more than (n−2), from said flash lamp and performing the (i+1)th flash irradiation, the first non-irradiation time period being a time period between performing the (i+1)th flash irradiation and performing the (i+2)th flash irradiation.

23. The heat treatment apparatus according to claim 22, wherein
said light emission controller includes a switching element connected in series with said flash lamp, said capacitor, and a coil.

24. The heat treatment apparatus according to claim 23, wherein
said switching element is an insulated-gate bipolar transistor.

* * * * *